United States Patent
Miyake

(10) Patent No.: US 8,912,985 B2
(45) Date of Patent: Dec. 16, 2014

(54) METHOD FOR DRIVING DISPLAY DEVICE

(75) Inventor: Hiroyuki Miyake, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 243 days.

(21) Appl. No.: 13/461,206

(22) Filed: May 1, 2012

(65) Prior Publication Data

US 2012/0287024 A1    Nov. 15, 2012

(30) Foreign Application Priority Data

May 12, 2011    (JP) ................. 2011-107032

(51) Int. Cl.
G09G 3/30    (2006.01)
G09G 3/32    (2006.01)
H01L 29/786  (2006.01)

(52) U.S. Cl.
CPC ........ G09G 3/3225 (2013.01); *G09G 2320/045* (2013.01); *G09G 2330/021* (2013.01); *H01L 29/7869* (2013.01)
USPC .......................................................... 345/76

(58) Field of Classification Search
USPC .................................................. 345/76–81
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

(Continued)

*Primary Examiner* — Kevin M Nguyen
*Assistant Examiner* — Cory Almeida
(74) *Attorney, Agent, or Firm* — Eric J. Robinson; Robinson Intellectual Property Law Office, P.C.

(57) ABSTRACT

In a display device using a light-emitting element or the like, the power consumption is reduced without reducing the display quality. A first operation and a second operation are carried out. In the first operation, a threshold voltage of a transistor is held in a capacitor. In the second operation, a signal potential corresponding to an image signal and the threshold voltage are added with the use of a capacitive coupling by the capacitor and are input to a gate of the transistor, so that a drain current of the transistor flows into a load element. The first operation is carried out once in a plurality of frames. A switch that determines whether the capacitor is electrically connected to a wiring to which a power supply potential is input is provided. A transistor in which a channel is formed in an oxide semiconductor layer is used as the switch.

20 Claims, 14 Drawing Sheets

(56) References Cited

U.S. PATENT DOCUMENTS

| | | |
|---|---|---|
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,173,590 B2 | 2/2007 | Uchino et al. |
| 7,211,825 B2 | 5/2007 | Shih et al |
| 7,259,737 B2 | 8/2007 | Ono et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,612,749 B2 | 11/2009 | Libsch et al. |
| 7,671,826 B2 | 3/2010 | Kimura |
| 7,674,650 B2 | 3/2010 | Akimoto et al. |
| 7,732,819 B2 | 6/2010 | Akimoto et al. |
| 7,817,117 B2 | 10/2010 | Kimura |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208971 A1* | 9/2006 | Deane .............................. 345/76 |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0256057 A1* | 11/2006 | Han et al. ......................... 345/92 |
| 2006/0284171 A1 | 12/2006 | Levy et al. |
| 2006/0284172 A1 | 12/2006 | Ishii |
| 2006/0290614 A1* | 12/2006 | Nathan et al. .................... 345/76 |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0126664 A1 | 6/2007 | Kimura |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0225061 A1* | 9/2008 | Kimura et al. ................. 345/690 |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-295131 A | 10/2004 |
| JP | 2004-341359 A | 12/2004 |
| JP | 2005-345722 A | 12/2005 |
| JP | 2007-179041 A | 7/2007 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductor,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDM '08 : Proceedings of the 15th International Display Workshops Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

(56) References Cited

OTHER PUBLICATIONS

Prins.M et al., "A Ferroelectric Transparent Thin-Film Transistor,", Appl. Phys. Lett. (Applied Physics Letters), Jun. 17, 1996, vol. 68, No. 25, pp. 3650-3652.
Nakamura.M et al., "The phase relations in the In2O3—Ga2ZnO4—ZnO system at 1350° C.,", Journal of Solid Stste Chemistry, Aug. 1, 1991, vol. 93, No. 2, pp. 298-315.
Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Sigest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-in. AMOLED Display With Driver Circuit Using Amorphous In—Ga—Zn—Oxide TFTs,", IDW '09 : Proceedings of the 16th International Display Workshops, 2009, pp. 689-692.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID'07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 in. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "Suftla Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshop, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

(56) References Cited

OTHER PUBLICATIONS

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3-A2O3-BO Systems [A; Fe, Ga, Or, Al; B: Mg, Mn, Fe, Ni, Cu, or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Kamiya et al., "Carrier Transport Properties and Electronic Structures of Amorphous Oxide Semiconductors: the present status," Solid State Physics, Sep. 1, 2009, vol. 44, No. 9, pp. 621-633, Agne Gijutsu Center.

\* cited by examiner

| | F1 | | | F2 | | |
|---|---|---|---|---|---|---|
| | T1 | T2 | T3 | T1 | T2 | T3 |
| 201 | off | off | on | off | off | on |
| 202 | on | on | off | off | off | off |
| 203 | on | one of or both are off | off | off | off | off |
| 204 | on | | on | on | on | on |
| 205 | on | on | off | off | off | off |
| 11 | on | on→off | sig1 | sig1 | sig1 | sig2 |
| D | | | Vsig1 | | | Vsig2 |

|  | F1 | | | F2 | | |
|---|---|---|---|---|---|---|
|  | T1 | T2 | T3 | T1 | T2 | T3 |
| 201 | off | off | on | off | off | on |
| 202 | on | on | off | off | off | off |
| 203 | on | off | off | off | off | off |
| 205 | on | on | off | off | off | off |
| 11 | on | on→off | sig1 | sig1 | sig1 | sig2 |
| D |  |  | Vsig1 |  |  | Vsig2 |

|  | F1 | | | F2 | | |
|---|---|---|---|---|---|---|
|  | T1 | T2 | T3 | T1 | T2 | T3 |
| 201 | off | off | on | off | off | on |
| 202 | on | on | off | off | off | off |
| 203 | on | off | off | off | off | off |
| 204 | on/off | on/off | on | on | on | on |
| 205 | on | on | off | off | off | off |
| 11 | on | on→off | sig1 | sig1 | sig1 | sig2 |
| D |  |  | Vsig1 |  |  | Vsig2 |

|  | F1 | | | F2 | | |
| --- | --- | --- | --- | --- | --- | --- |
|  | T1 | T2 | T3 | T1 | T2 | T3 |
| 201 | off | off | on | off | off | on |
| 202 | on | on | off | off | off | off |
| 203 | on | off | off | off | off | off |
| 204 | on/off | on/off | on | on | on | on |
| 205 | on | on | off | off | off | off |
| 11 | on | on→off | sig1 | sig1 | sig1 | sig2 |
| D |  |  | Vsig1 |  |  | Vsig2 |

● In
☾ Sn
☽ Zn
● O

● In
○ Ga
○ Zn
● O

METHOD FOR DRIVING DISPLAY DEVICE

BACKGROUND OF THE INVENTION

1. Field of the Invention

The present invention relates to a semiconductor device using a transistor and a method for driving the semiconductor device. In particular, the present invention relates to a display device including pixels each provided with a transistor and a load element and displaying images by controlling a current that flows through the load element and a method for driving the display device. The load element can be an electrooptic element the luminance of which is controlled by the value of a current that flows. For example, it is possible to use a light-emitting element such as an electroluminescent element (hereinafter referred to as an EL element) as the load element. In addition, the present invention relates to an electronic device using the semiconductor device.

2. Description of the Related Art

Having increased visibility and no limitations on the viewing angle and being suitable for reduction in thickness, a display device using a light-emitting element has been attracting attention. The following structure can be employed for an active matrix display device using a light-emitting element: each pixel includes at least a light-emitting element, a transistor controlling input of a video signal to the pixel (a switching transistor), and a transistor controlling the value of a current supplied to the light-emitting element (a driver transistor).

Here, a drain current (a current which flows between a source and a drain when a transistor is in an on state) of the driver transistor is supplied to the light-emitting element. Variations in the threshold voltages of driver transistors in the pixels lead to variations in the drain currents of the driver transistors, which affects the luminance of the light-emitting elements. Further, as the threshold voltage of the driver transistor changes owing to deterioration over time or the like, the drain current of the driver transistor changes; consequently, the luminance of the light-emitting element is changed. Therefore, in order to improve the image quality of a display device, it is an important object to propose a pixel configuration in which a voltage applied between a gate and a source of each driver transistor can be adjusted in anticipation of variations and changes in threshold voltages of the driver transistors. For example, a pixel configuration described in Patent Document 1 has been proposed.

In a display device described in Patent Document 1, the threshold voltage of a driver transistor (a drive transistor in Patent Document 1) is held in a capacitor, and then the threshold voltage is added to an image signal (Vsig in Patent Document 1) and applied between a gate and a source of the driver transistor. Thus, a structure is proposed in which even when there are variations and changes in the threshold voltages, variations and changes in the drain currents of the driver transistors are reduced and variations and changes in the luminance of light-emitting elements supplied with the drain currents can be suppressed; with such a structure, the display quality is promoted (see FIG. 4 and FIG. 5 and description thereof in Patent Document 1).

REFERENCE

[Patent Document 1] Japanese Published Patent Application No. 2005-345722

SUMMARY OF THE INVENTION

In the display device described in Patent Document 1, an operation for holding the threshold voltage of the driver transistor in the capacitor is carried out in every field (also referred to as a frame). A pixel cannot display images while the operation is carried out in the pixel. In addition, in the operation for holding the threshold voltage in the capacitor, a plurality of transistors each having a function of a switch needs to be operated. Since the operation is carried out in every frame, a driver circuit for driving these switches also needs to be operated, which leads to an increase in power consumption.

In view of the above, an object is to reduce the power consumption of a display device using a light-emitting element or the like without reducing the display quality.

In a method for driving a display device that is one embodiment of the present invention, a first operation and a second operation are carried out. In the first operation, a threshold voltage of a transistor is held in a capacitor (hereinafter the first operation is also referred to as an operation for obtaining the threshold voltage). In the second operation, a signal potential corresponding to an image signal and the threshold voltage are added with the use of a capacitive coupling by the capacitor and are input to a gate of the transistor, so that a drain current of the transistor flows into a load element. The first operation is carried out once in a plurality of frames. For example, the first operation is carried out once in ten or more frames. For example, the first operation is carried out once in 3600 or more frames. The first operation is carried out once in one or more minutes.

In a method for driving a display device that is one embodiment of the present invention, a first operation and a second operation are carried out. In the first operation, a threshold voltage of a transistor is held in a capacitor. In the second operation, a signal potential corresponding to an image signal is input to one of a pair of electrodes of the capacitor and a potential of the other of the pair of electrodes of the capacitor is input to a gate of the transistor, so that a drain current of the transistor flows into a load element. The first operation is carried out once in a plurality of frames. For example, the first operation is carried out once in ten or more frames. For example, the first operation is carried out once in 3600 or more frames. The first operation is carried out once in one or more minutes.

For example, the frequency of the first operation is lower than the frequency of the second operation.

A pixel in the display device may include a switch that determines whether the capacitor is electrically connected to a wiring to which a power supply potential is input, and a transistor with extremely small off-state current may be used as the switch. The pixel may include a plurality of switches, and any of or all of the plurality of switches may be formed using a transistor with extremely small off-state current. Alternatively, the pixel in the display device may include a first switch that determines whether the capacitor is electrically connected to a first wiring to which a first power supply potential is input, and a second switch that determines whether the capacitor is electrically connected to a second wiring to which a second power supply potential different from the first power supply potential is input. The first switch and the second switch may each be formed using a transistor with extremely small off-state current. The pixel may include a plurality of first switches, and any of or all of the plurality of first switches may be formed using a transistor with extremely small off-state current; the pixel may include a plurality of second switches, and any of or all of the plurality of second switches may be formed using a transistor with extremely small off-state current.

The load element can be an electrooptic element the luminance of which is controlled by a value of a current that flows.

For example, a light-emitting element such as an electroluminescent element (EL element) can be used as the load element.

In the case of an n-channel transistor, the off-state current of the transistor is a current that flows between a source and a drain in the following state: the potential of a gate is 0 V or lower when the potential of the source, which is lower than that of the drain, is a reference potential. In the case of a p-channel transistor, the off-state current of the transistor is a current that flows between a source and a drain in the following state: the potential of a gate is 0 V or higher when the potential of the source, which is higher than that of the drain, is a reference potential.

A transistor with extremely small off-state current can be a transistor in which a channel is formed in a layer or a substrate formed using a semiconductor layer with a band gap wider than that of silicon. A compound semiconductor is an example of the semiconductor with a band gap wider than that of silicon. Examples of the compound semiconductor include an oxide semiconductor, a nitride semiconductor, and the like. The transistor with extremely small off-state current can be, for example, a transistor in which a channel is formed in an oxide semiconductor layer.

The operation for obtaining the threshold voltage is carried out once in a plurality of frames, whereby the power consumption of the display device can be reduced.

In particular, a transistor with extremely small off-state current is used as a switch that determines whether the capacitor is electrically connected to the wiring to which a power supply potential is input, so that leakage of electric charges held in the capacitor through the switch after the operation for obtaining the threshold voltage can be prevented. Thus, the obtained threshold voltage can be held in the capacitor for a long period. For this reason, the frequency of the operation for obtaining the threshold voltage can be reduced. Consequently, a display device with reduced power consumption can be fabricated without reducing the display quality.

DETAILED DESCRIPTION OF THE INVENTION

Figures 1A, 1B:
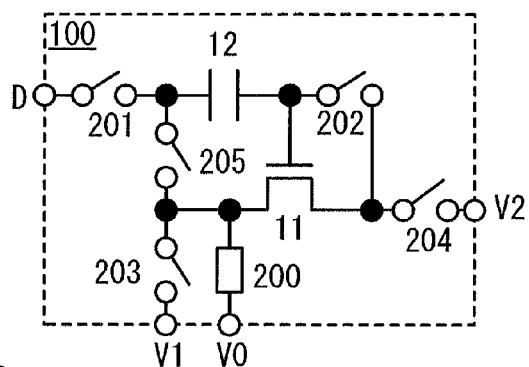
FIGS. 1A and 1B are a diagram of a configuration of a pixel circuit and a timing chart of a driving method.

Embodiments of the present invention will be described below with reference to the accompanying drawings. However, the present invention is not limited to the following description and it is easily understood by those skilled in the art that the modes and details can be variously changed without departing from the scope and spirit of the present invention. Therefore, the invention should not be construed as being limited to the description of the embodiments below.

Functions of a "source" and a "drain" are sometimes replaced with each other when a transistor of opposite polarity is used or when the direction of a current flow is changed in circuit operation, for example. Therefore, the terms "source" and "drain" can be replaced with each other in this specification.

The term "electrically connected" includes the case where components are connected through an "object having any electric function". There is no particular limitation on the "object having any electric function" as long as electric signals can be transmitted and received between the components connected through the object. Examples of the "object having any electric function" are a switching element such as a transistor, a resistor, an inductor, a capacitor, and an element with a variety of functions as well as an electrode and a wiring.

Even when a circuit diagram shows independent components as if they are electrically connected to each other, one conductive layer may have functions of a plurality of components, for example, part of a wiring may also function as an electrode. The "electrical connection" in this specification includes in its category such a case where one conductive layer has functions of a plurality of components.

The term "over" or "below" does not necessarily mean that a component is placed "directly on" or "directly under" another component. For example, the expression "a gate electrode over a gate insulating layer" can mean the case where a component is placed between the gate insulating layer and the gate electrode.

The position, size, range, or the like of each component shown in the drawings and the like is not accurately represented in some cases for easy understanding. Therefore, the disclosed invention is not necessarily limited to the position, size, range, or the like disclosed in the drawings and the like.

The ordinal number such as "first", "second", and "third" are used in order to avoid confusion among components.

(Embodiment 1)

One mode of a method for driving a display device that is one embodiment of the present invention will be described.

(Configuration of Display Device)

First, description will be given of a configuration of the display device. FIG. 1A shows one mode of the display device. The display device includes a plurality of pixels 100. Each of the pixels 100 includes a transistor 11, a load element 200, a capacitor 12, a switch 201, a switch 202, a switch 203, a switch 204, and a switch 205. The transistor 11 corresponds to a driver transistor.

One of a source and a drain of the transistor 11 is electrically connected to a terminal V1 through the switch 203. The one of the source and the drain of the transistor 11 is electrically connected to one of a pair of electrodes of the load element 200. The one of the source and the drain of the transistor 11 is electrically connected to one of a pair of electrodes of the capacitor 12 through the switch 205. The one of the pair of electrodes of the capacitor 12 is electrically connected to a terminal D through the switch 201. The other of the pair of electrodes of the capacitor 12 is electrically connected to a gate of the transistor 11. The other of the pair of electrodes of the load element 200 is electrically connected to a terminal V0. The other of the source and the drain of the transistor 11 is electrically connected to a terminal V2 through the switch 204. The other of the source and the drain of the transistor 11 is electrically connected to the gate of the transistor 11 through the switch 202.

A power supply potential is supplied to each of the terminal V0, the terminal V1, and the terminal V2. That is, a high power supply potential or a low power supply potential is supplied. In other words, the terminal V0, the terminal V1, and the terminal V2 are each electrically connected to a wiring to which the power supply potential is supplied. For example, when the transistor 11 is an n-channel transistor, a low power supply potential can be supplied to each of the terminal V0 and the terminal V1 and a high power supply potential can be supplied to the terminal V2. For example, when the transistor 11 is a p-channel transistor, a high power supply potential can be supplied to each of the terminal V0 and the terminal V1 and a low power supply potential can be supplied to the terminal V2.

As the load element 200, an electrooptic element the luminance of which is controlled by the value of a current flowing between a pair of electrodes can be used. For example, a light-emitting element such as an electroluminescent element (EL element) can be used as the load element 200. When an EL element is used as the load element 200, the one of the pair of electrodes of the load element 200 can be an anode and the other thereof can be a cathode. Further, the one of the pair of electrodes of the load element 200 may be a cathode and the other thereof may be an anode.

Each of the switch 201, the switch 202, the switch 203, the switch 204, and the switch 205 can be formed using a transistor. Either an n-channel transistor or a p-channel transistor may be used as the transistor 11, the switch 201, the switch 202, the switch 203, the switch 204, and the switch 205. The transistors included in the pixel 100 may have the same conductivity or a combination of transistors with different conductivity may be included in the pixel 100. With the pixel 100 including transistors having the same conductivity, a manufacturing process of the display device can be simplified.

(Method for Driving Display Device)

A method for driving the pixel 100 having the configuration shown in FIG. 1A will be described. FIG. 1B is a timing chart of the method for driving the pixel 100 having the configuration shown in FIG. 1A. In the timing chart, the respective states (whether the switches are in an on state or an off state) of the switch 201, the switch 202, the switch 203, the switch 204, and the switch 205 in periods T1 to T3 of a first frame F1 and periods T1 to T3 of a second frame F2 are listed in the respective lines of "201", "202", "203", "204", and "205". Note that the term "one of or both are off" in the period T2 of the first frame F1 indicates that one of or both the switch 203 and the switch 204 are in an off state. The states of the transistor 11 are listed in the line of "11". Note that "on→off" in the line of "11" indicates that the transistor 11 is changed from an on state to an off state. In the line of "11", "sig1" indicates that the transistor 11 can pass a drain current corresponding to a signal potential Vsig1 of an image signal, and "sig2" indicates that the transistor 11 can pass a drain current corresponding to a signal potential Vsig2 of an image signal. Signals input to the terminal D are listed in a line of "D". In the line of "D", "Vsig1" indicates that the signal potential Vsig1 corresponding to an image signal is input to the terminal D, and "Vsig2" indicates that the signal potential Vsig2 corresponding to an image signal is input to the terminal D. Note that the signal potential Vsig1 and the signal potential Vsig2 change depending on displayed images; therefore, the signal potential Vsig1 and the signal potential Vsig2 may be the same or different from each other. Shaded areas in the lines of "D" each indicate a given potential.

The operation in each period will be described below in detail. In the period T1 of the first frame F1, the switch 202, the switch 203, the switch 204, and the switch 205 are turned on, so that electric charges are accumulated in the capacitor 12. Thus, a voltage higher than or equal to the threshold voltage (hereinafter also referred to as Vth) of the transistor 11 is held between the pair of electrodes of the capacitor 12. At this time, the transistor 11 is in an on state because the voltage held in the capacitor 12 is applied between the gate and the source.

Next, in the period T2 of the first frame F1, one of or both the switch 203 and the switch 204 are turned off while the switch 202 and the switch 205 are in the on state. Thus, the electric charges accumulated in the capacitor 12 move through the source and the drain of the transistor 11. Then, when the voltage between the pair of electrodes of the capacitor 12 becomes equal to the threshold voltage (Vth) of the transistor 11, the transistor 11 is turned off and movement of the electric charges is stopped. Thus, the threshold voltage (Vth) of the transistor 11 is held between the pair of electrodes of the capacitor 12, so that the threshold voltage (Vth) of the transistor 11 can be obtained. The operations in the periods T1 and T2 of the first frame F1 correspond to an operation for obtaining the threshold voltage.

Then, in the period T3 of the first frame F1, the switch 201 is turned on, the switch 202, the switch 203, and the switch 205 are turned off, and the switch 204 is turned on. The signal potential Vsig1 is input to the terminal D. Thus, the signal potential Vsig1 and the threshold voltage (Vth) of the transistor 11 are added and input to the gate of the transistor 11 owing to the capacitive coupling by the capacitor 12. Then, a drain current corresponding to the signal potential Vsig1 of an image signal flows through the transistor 11 and is supplied to the load element 200. The display device displays images in such a manner.

After the operation for obtaining the threshold voltage is carried out in the first frame F1, the operation for obtaining the threshold voltage is not carried out in the subsequent second frame F2. In the second frame F2, the switch 202, the switch 203, and the switch 205 remain to be turned off. The switch 204 remains to be turned on. Thus, in the second frame F2, the driver circuit for driving the switches does not need to operate, which leads to a reduction in the power consumption of the display device.

In the period T3 of the second frame F2, the signal potential Vsig2 of an image signal is input to the terminal D and the signal potential Vsig2 and the threshold voltage (Vth) of the transistor 11 are added and input to the gate of the transistor 11 owing to the capacitive coupling by the capacitor 12. Then, a drain current corresponding to the signal potential Vsig2 of the image signal flows through the transistor 11 and is supplied to the load element 200. The display device displays images in such a manner.

Note that in FIG. 1B, the first frame F1 and the second frame F2 are typically shown, but one embodiment of the present invention is not limited thereto. The operation for obtaining the threshold voltage can be carried out once in a plurality of frames. In a frame in which the operation for obtaining the threshold voltage is carried out, driving is performed in a manner similar to that in the first frame F1, and in a frame in which the operation for obtaining the threshold voltage is not carried out, driving is performed in a manner similar to that in the second frame F2.

Here, a transistor with extremely small off-state current is used as a switch for determining whether the capacitor 12 is electrically connected to the terminal to which a power supply potential is input (the terminal V1, the terminal V2, or the terminal V0), whereby leakage of electric charges from the capacitor 12 after the operation for obtaining the threshold voltage can be suppressed. For example, a transistor with extremely small off-state current is used as the switch 202 for determining whether the capacitor 12 is electrically connected to the terminal V2, whereby leakage from the capacitor 12 can be reduced. The transistor with extremely small off-state current can be, for example, a transistor in which a channel is formed in an oxide semiconductor layer.

The frequency of the operation of obtaining threshold voltage can be further reduced by suppressing leakage of electric charges from the capacitor 12 after the operation. For example, the operation for obtaining the threshold voltage can be carried out once in ten or more frames. For example, the operation for obtaining the threshold voltage is carried out once in 3600 or more frames. The operation for obtaining the threshold voltage can be carried out once in one or more minutes. Thus, the power consumption of the display device can be reduced without reducing the display quality.

This embodiment can be implemented combining with any of the other embodiments as appropriate.

(Embodiment 2)

One mode of a method for driving a display device that is one embodiment of the present invention will be described.

(Configuration of Display Device)

Figures 2A, 2B:
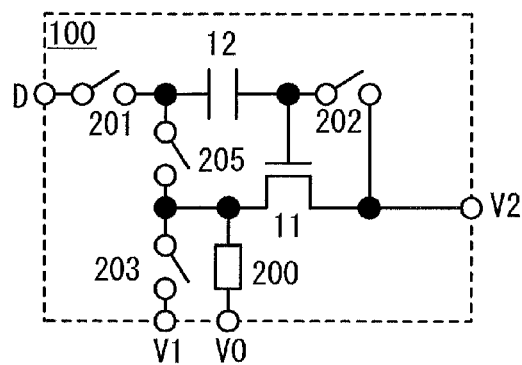
FIGS. 2A and 2B are a diagram of a configuration of a pixel circuit and a timing chart of a driving method.

First, description will be given of a configuration of the display device. FIG. 2A shows one mode of the display device. The display device includes a plurality of pixels 100. A configuration of the pixel 100 shown in FIG. 2A corresponds to a configuration in which the switch 204 is omitted from the pixel 100 shown in FIG. 1A. Configuration other than the above is similar to that in FIG. 1A, so that description thereof will not be repeated.

(Method for Driving Display Device)

A method for driving the pixel 100 having the configuration shown in FIG. 2A will be described. FIG. 2B is a timing chart of the method for driving the pixel 100 having the configuration shown in FIG. 2A. In the timing chart, the respective states (whether the switches are in an on state or an off state) of the switch 201, the switch 202, the switch 203, and the switch 205 in periods T1 to T3 of a first frame F1 and periods T1 to T3 of a second frame F2 are listed in the respective lines of "201", "202", "203", and "205". The states of the transistor 11 are listed in the line of "11". Note that "on→off" in the line of "11" indicates that the transistor 11 is changed from an on state to an off state. In the line of "11", "sig1" indicates that the transistor 11 can pass a drain current corresponding to a signal potential Vsig1 of an image signal, and "sig2" indicates that the transistor 11 can pass a drain current corresponding to a signal potential Vsig2 of an image signal. Signals input to the terminal D are listed in a line of "D". In the line of "D", "Vsig1" indicates that the signal potential Vsig1 corresponding to an image signal is input to the terminal D, and "Vsig2" indicates that the signal potential Vsig2 corresponding to an image signal is input to the terminal D. Note that the signal potential Vsig1 and the signal potential Vsig2 change depending on displayed images; therefore, the signal potential Vsig1 and the signal potential Vsig2 may be the same or different from each other. Shaded areas in the lines of "D" each indicate a given potential.

The operation in each period will be described below in detail. In the period T1 of the first frame F1, the switch 202, the switch 203, and the switch 205 are turned on, so that electric charges are accumulated in the capacitor 12. Thus, a voltage higher than or equal to the threshold voltage (hereinafter also referred to as Vth) of the transistor 11 is held between the pair of electrodes of the capacitor 12. At this time, the transistor 11 is in an on state because the voltage held in the capacitor 12 is applied between the gate and the source.

Next, in the period T2 of the first frame F1, the switch 203 is turned off while the switch 202 and the switch 205 are in the on state. Thus, the electric charges accumulated in the capacitor 12 move through the source and the drain of the transistor 11. Then, when the voltage between the pair of electrodes of the capacitor 12 becomes equal to the threshold voltage (Vth) of the transistor 11, the transistor 11 is turned off and movement of the electric charges is stopped. Thus, the threshold voltage (Vth) of the transistor 11 is held between the pair of electrodes of the capacitor 12, so that the threshold voltage (Vth) of the transistor 11 can be obtained. The operations in the periods T1 and T2 of the first frame F1 correspond to an operation for obtaining the threshold voltage.

Then, in the period T3 of the first frame F1, the switch 201 is turned on, the switch 202, the switch 203, and the switch 205 are turned off. The signal potential Vsig1 is input to the terminal D. Thus, the signal potential Vsig1 and the threshold voltage (Vth) of the transistor 11 are added and input to the gate of the transistor 11 owing to the capacitive coupling by the capacitor 12. Then, a drain current corresponding to the signal potential Vsig1 of an image signal flows through the transistor 11 and is supplied to the load element 200. The display device displays images in such a manner.

After the operation for obtaining the threshold voltage is carried out in the first frame F1, the operation for obtaining the threshold voltage is not carried out in the subsequent second frame F2. In the second frame F2, the switch 202, the switch 203, and the switch 205 remain to be turned off. Thus, in the second frame F2, the driver circuit for driving the switches does not need to operate, which leads to a reduction in the power consumption of the display device.

In the period T3 of the second frame F2, the signal potential Vsig2 of an image signal is input to the terminal D and the signal potential Vsig2 and the threshold voltage (Vth) of the transistor 11 are added and input to the gate of the transistor 11 owing to the capacitive coupling by the capacitor 12. Then, a drain current corresponding to the signal potential Vsig2 of the image signal flows through the transistor 11 and is supplied to the load element 200. The display device displays images in such a manner.

Note that in FIG. 2B, the first frame F1 and the second frame F2 are typically shown, but one embodiment of the present invention is not limited thereto. The operation for obtaining the threshold voltage can be carried out once in a plurality of frames. In a frame in which the operation for obtaining the threshold voltage is carried out, driving is performed in a manner similar to that in the first frame F1, and in a frame in which the operation for obtaining the threshold voltage is not carried out, driving is performed in a manner similar to that in the second frame F2.

Here, a transistor with extremely small off-state current is used as a switch for determining whether the capacitor 12 is electrically connected to the terminal to which a power supply potential is input (the terminal V1, the terminal V2, or the terminal V0), whereby leakage of electric charges from the capacitor 12 after the operation for obtaining the threshold voltage can be suppressed. For example, a transistor with extremely small off-state current is used as the switch 202 for determining whether the capacitor 12 is electrically connected to the terminal V2, whereby leakage from the capacitor 12 can be reduced. The transistor with extremely small off-state current can be, for example, a transistor in which a channel is formed in an oxide semiconductor layer.

The frequency of the operation of obtaining threshold voltage can be further reduced by suppressing leakage of electric charges from the capacitor 12 after the operation. For example, the operation for obtaining the threshold voltage can be carried out once in ten or more frames. For example, the operation for obtaining the threshold voltage is carried out once in 3600 or more frames. The operation for obtaining the threshold voltage can be carried out once in one or more minutes. Thus, the power consumption of the display device can be reduced without reducing the display quality.

This embodiment can be implemented combining with any of the other embodiments as appropriate.

(Embodiment 3)

One mode of a method for driving a display device that is one embodiment of the present invention will be described.

(Configuration of Display Device)

Figures 3A, 3B:
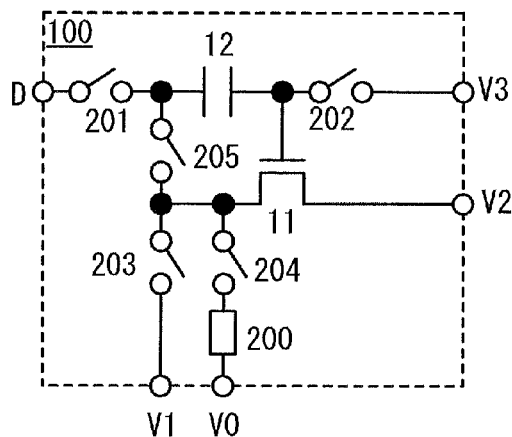
FIGS. 3A and 3B are a diagram of a configuration of a pixel circuit and a timing chart of a driving method.

First, description will be given of a configuration of the display device. FIG. 3A shows one mode of the display device. The display device includes a plurality of pixels 100. Each of the pixels 100 includes the transistor 11, the load element 200, the capacitor 12, the switch 201, the switch 202, the switch 203, the switch 204, and the switch 205. The transistor 11 corresponds to a driver transistor.

One of a source and a drain of the transistor 11 is electrically connected to the terminal V1 through the switch 203. The one of the source and the drain of the transistor 11 is electrically connected to one of a pair of electrodes of the load element 200 through the switch 204. The one of the source and the drain of the transistor 11 is electrically connected to one of a pair of electrodes of the capacitor 12 through the switch 205. The one of the pair of electrodes of the capacitor 12 is electrically connected to the terminal D through the switch 201. The other of the pair of electrodes of the capacitor 12 is electrically connected to a gate of the transistor 11. The other of the pair of electrodes of the load element 200 is electrically connected to the terminal V0. The other of the source and the drain of the transistor 11 is electrically connected to the terminal V2. The gate of the transistor 11 is electrically connected to a terminal V3 through the switch 202.

A power supply potential is supplied to each of the terminal V0, the terminal V1, the terminal V2, and the terminal V3. That is, a high power supply potential or a low power supply potential is supplied. In other words, the terminal V0, the terminal V1, the terminal V2, and the terminal V3 are each electrically connected to a wiring to which the power supply potential is supplied. For example, when the transistor 11 is an n-channel transistor, a low power supply potential can be supplied to each of the terminal V0 and the terminal V1 and a high power supply potential can be supplied to each of the terminal V2 and the terminal V3. For example, when the transistor 11 is a p-channel transistor, a high power supply potential can be supplied to each of the terminal V0 and the terminal V1 and a low power supply potential can be supplied to each of the terminal V2 and the terminal V3.

As the load element 200, an electrooptic element the luminance of which is controlled by the value of a current flowing between a pair of electrodes can be used. For example, a light-emitting element such as an electroluminescent element (EL element) can be used as the load element 200. When an EL element is used as the load element 200, the one of the pair of electrodes of the load element 200 can be an anode and the other thereof can be a cathode. Further, the one of the pair of electrodes of the load element 200 may be a cathode and the other thereof may be an anode.

Each of the switch 201, the switch 202, the switch 203, the switch 204, and the switch 205 can be formed using a transistor. Either an n-channel transistor or a p-channel transistor may be used as the transistor 11, the switch 201, the switch 202, the switch 203, the switch 204, and the switch 205. The transistors included in the pixel 100 may have the same conductivity or a combination of transistors with different conductivity may be included in the pixel 100. With the pixel 100 including transistors having the same conductivity, a manufacturing process of the display device can be simplified.

(Method for Driving Display Device)

A method for driving the pixel 100 having the configuration shown in FIG. 3A will be described. FIG. 3B is a timing chart of the method for driving the pixel 100 having the configuration shown in FIG. 3A. In the timing chart, the respective states (whether the switches are in an on state or an off state) of the switch 201, the switch 202, the switch 203, the switch 204, and the switch 205 in periods T1 to T3 of a first frame F1 and periods T1 to T3 of a second frame F2 are listed in the respective lines of "201", "202", "203", "204", and "205". Note that in the periods T1 and T2 of the first frame F1, "on/off" indicates that the switch 204 may be turned on or turned off. The states of the transistor 11 are listed in the line of "11". Note that "on→off" in the line of "11" indicates that the transistor 11 is changed from an on state to an off state. In the line of "11", "sig1" indicates that the transistor 11 can pass a drain current corresponding to a signal potential Vsig1 of an image signal, and "sig2" indicates that the transistor 11 can pass a drain current corresponding to a signal potential Vsig2 of an image signal. Signals input to the terminal D are listed in a line of "D". In the line of "D", "Vsig1" indicates that the signal potential Vsig1 corresponding to an image signal is input to the terminal D, and "Vsig2" indicates that the signal potential Vsig2 corresponding to an image signal is input to the terminal D. Note that the signal potential Vsig1 and the signal potential Vsig2 change depending on displayed images; therefore, the signal potential Vsig1 and the signal potential Vsig2 may be the same or different from each other. Shaded areas in the lines of "D" each indicate a given potential.

The operation in each period will be described below in detail. In the period T1 of the first frame F1, the switch 202, the switch 203, and the switch 205 are turned on, so that electric charges are accumulated in the capacitor 12. Thus, a voltage higher than or equal to the threshold voltage (hereinafter also referred to as Vth) of the transistor 11 is held between the pair of electrodes of the capacitor 12. At this time, the transistor 11 is in an on state because the voltage held in the capacitor 12 is applied between the gate and the source.

Next, in the period T2 of the first frame F1, the switch 203 is turned off while the switch 202 and the switch 205 are in the on state. Thus, the electric charges accumulated in the capacitor 12 move through the source and the drain of the transistor 11. Then, when the voltage between the pair of electrodes of the capacitor 12 becomes equal to the threshold voltage (Vth) of the transistor 11, the transistor 11 is turned off and movement of the electric charges is stopped. Thus, the threshold voltage (Vth) of the transistor 11 is held between the pair of electrodes of the capacitor 12, so that the threshold voltage (Vth) of the transistor 11 can be obtained. The operations in the periods T1 and T2 of the first frame F1 correspond to an operation for obtaining the threshold voltage.

Then, in the period T3 of the first frame F1, the switch 201 is turned on, the switch 202, the switch 203, and the switch 205 are turned off, and the switch 204 is turned on. The signal potential Vsig1 is input to the terminal D. Thus, the signal potential Vsig1 and the threshold voltage (Vth) of the transistor 11 are added and input to the gate of the transistor 11 owing to the capacitive coupling by the capacitor 12. Then, a drain current corresponding to the signal potential Vsig1 of an image signal flows through the transistor 11 and is supplied to the load element 200. The display device displays images in such a manner.

After the operation for obtaining the threshold voltage is carried out in the first frame F1, the operation for obtaining the threshold voltage is not carried out in the subsequent second frame F2. In the second frame F2, the switch 202, the switch 203, and the switch 205 remain to be turned off. The switch 204 remains to be turned on. Thus, in the second frame F2, the driver circuit for driving the switches does not need to operate, which leads to a reduction in the power consumption of the display device.

In the period T3 of the second frame F2, the signal potential Vsig2 of an image signal is input to the terminal D and the signal potential Vsig2 and the threshold voltage (Vth) of the transistor 11 are added and input to the gate of the transistor 11 owing to the capacitive coupling by the capacitor 12. Then, a drain current corresponding to the signal potential Vsig2 of the image signal flows through the transistor 11 and is supplied to the load element 200. The display device displays images in such a manner.

Note that in FIG. 3B, the first frame F1 and the second frame F2 are typically shown, but one embodiment of the present invention is not limited thereto. The operation for obtaining the threshold voltage can be carried out once in a plurality of frames. In a frame in which the operation for obtaining the threshold voltage is carried out, driving is performed in a manner similar to that in the first frame F1, and in a frame in which the operation for obtaining the threshold voltage is not carried out, driving is performed in a manner similar to that in the second frame F2.

Here, a transistor with extremely small off-state current is used as a switch for determining whether the capacitor 12 is electrically connected to the terminal to which a power supply potential is input (the terminal V1, the terminal V2, the terminal V3, or the terminal V0), whereby leakage of electric charges from the capacitor 12 after the operation for obtaining the threshold voltage can be suppressed. For example, a transistor with extremely small off-state current is used as the switch 202 for determining whether the capacitor 12 is electrically connected to the terminal V3, whereby leakage from the capacitor 12 can be reduced. The transistor with extremely small off-state current can be, for example, a transistor in which a channel is formed in an oxide semiconductor layer.

The frequency of the operation of obtaining threshold voltage can be further reduced by suppressing leakage of electric charges from the capacitor 12 after the operation. For example, the operation for obtaining the threshold voltage can be carried out once in ten or more frames. For example, the operation for obtaining the threshold voltage is carried out once in 3600 or more frames. The operation for obtaining the threshold voltage can be carried out once in one or more minutes. Thus, the power consumption of the display device can be reduced without reducing the display quality.

This embodiment can be implemented combining with any of the other embodiments as appropriate.

(Embodiment 4)

One mode of a method for driving a display device that is one embodiment of the present invention will be described.

(Configuration of Display Device)

Figures 4A, 4B:
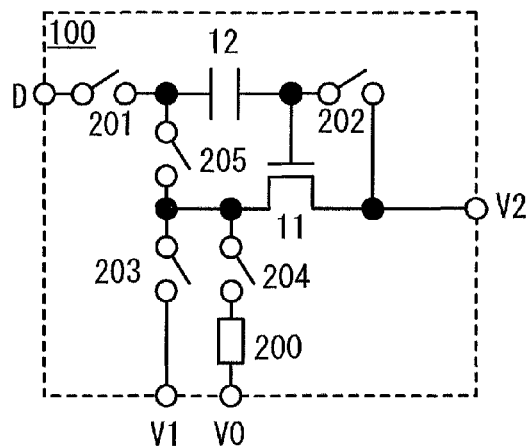
FIGS. 4A and 4B are a diagram of a configuration of a pixel circuit and a timing chart of a driving method.

First, description will be given of a configuration of the display device. FIG. 4A shows one mode of the display device. The display device includes a plurality of pixels 100. A configuration of the pixel 100 shown in FIG. 4A corresponds to a configuration in which the terminal V2 also serves as the terminal V3 in the pixel 100 shown in FIG. 3A. Configuration other than the above is similar to that in FIG. 3A, so that description thereof will not be repeated.

(Method for Driving Display Device)

A method for driving the pixel 100 having the configuration shown in FIG. 4A will be described. FIG. 4B is a timing chart of the method for driving the pixel 100 having the configuration shown in FIG. 4A. In the timing chart, the respective states (whether the switches are in an on state or an off state) of the switch 201, the switch 202, the switch 203, the switch 204, and the switch 205 in periods T1 to T3 of a first frame F1 and periods T1 to T3 of a second frame F2 are listed in the respective lines of "201", "202", "203", "204", and "205". Note that in the periods T1 and T2 of the first frame F1, "on/off" indicates that the switch 204 may be turned on or turned off. The states of the transistor 11 are listed in the line of "11". Note that "on→off" in the line of "11" indicates that the transistor 11 is changed from an on state to an off state. In the line of "11", "sig1" indicates that the transistor 11 can pass a drain current corresponding to a signal potential Vsig1 of an image signal, and "sig2" indicates that the transistor 11 can pass a drain current corresponding to a signal potential Vsig2 of an image signal. Signals input to the terminal D are listed in a line of "D". In the line of "D", "Vsig1" indicates that the signal potential Vsig1 corresponding to an image signal is input to the terminal D, and "Vsig2" indicates that the signal potential Vsig2 corresponding to an image signal is input to the terminal D. Note that the signal potential Vsig1 and the signal potential Vsig2 change depending on displayed images; therefore, the signal potential Vsig1 and the signal potential Vsig2 may be the same or different from each other. Shaded areas in the lines of "D" each indicate a given potential.

The operation in each period will be described below in detail. In the period T1 of the first frame F1, the switch 202, the switch 203, and the switch 205 are turned on, so that electric charges are accumulated in the capacitor 12. Thus, a voltage higher than or equal to the threshold voltage (hereinafter also referred to as Vth) of the transistor 11 is held between the pair of electrodes of the capacitor 12. At this time, the transistor 11 is in an on state because the voltage held in the capacitor 12 is applied between the gate and the source.

Next, in the period T2 of the first frame F1, the switch 203 is turned off while the switch 202 and the switch 205 are in the on state. Thus, the electric charges accumulated in the capacitor 12 move through the source and the drain of the transistor 11. Then, when the voltage between the pair of electrodes of the capacitor 12 becomes equal to the threshold voltage (Vth) of the transistor 11, the transistor 11 is turned off and movement of the electric charges is stopped. Thus, the threshold voltage (Vth) of the transistor 11 is held between the pair of electrodes of the capacitor 12, so that the threshold voltage (Vth) of the transistor 11 can be obtained. The operations in the periods T1 and T2 of the first frame F1 correspond to an operation for obtaining the threshold voltage.

Then, in the period T3 of the first frame F1, the switch 201 is turned on, the switch 202, the switch 203, and the switch 205 are turned off, and the switch 204 is turned on. The signal potential Vsig1 is input to the terminal D. Thus, the signal potential Vsig1 and the threshold voltage (Vth) of the transistor 11 are added and input to the gate of the transistor 11 owing to the capacitive coupling by the capacitor 12. Then, a drain current corresponding to the signal potential Vsig1 of an image signal flows through the transistor 11 and is supplied to the load element 200. The display device displays images in such a manner.

After the operation for obtaining the threshold voltage is carried out in the first frame F1, the operation for obtaining the threshold voltage is not carried out in the subsequent second frame F2. In the second frame F2, the switch 202, the switch 203, and the switch 205 remain to be turned off. The switch 204 remains to be turned on. Thus, in the second frame F2, the driver circuit for driving the switches does not need to operate, which leads to a reduction in the power consumption of the display device.

In the period T3 of the second frame F2, the signal potential Vsig2 of an image signal is input to the terminal D and the signal potential Vsig2 and the threshold voltage (Vth) of the transistor 11 are added and input to the gate of the transistor 11 owing to the capacitive coupling by the capacitor 12. Then, a drain current corresponding to the signal potential Vsig2 of the image signal flows through the transistor 11 and is supplied to the load element 200. The display device displays images in such a manner.

Note that in FIG. 4B, the first frame F1 and the second frame F2 are typically shown, but one embodiment of the present invention is not limited thereto. The operation for obtaining the threshold voltage can be carried out once in a plurality of frames. In a frame in which the operation for obtaining the threshold voltage is carried out, driving is performed in a manner similar to that in the first frame F1, and in a frame in which the operation for obtaining the threshold voltage is not carried out, driving is performed in a manner similar to that in the second frame F2.

Here, a transistor with extremely small off-state current is used as a switch for determining whether the capacitor 12 is electrically connected to the terminal to which a power supply potential is input (the terminal V1, the terminal V2, or the terminal V0), whereby leakage of electric charges from the capacitor 12 after the operation for obtaining the threshold voltage can be suppressed. For example, a transistor with extremely small off-state current is used as the switch 202 for determining whether the capacitor 12 is electrically connected to the terminal V2, whereby leakage from the capacitor 12 can be reduced. The transistor with extremely small off-state current can be, for example, a transistor in which a channel is formed in an oxide semiconductor layer.

The frequency of the operation of obtaining threshold voltage can be further reduced by suppressing leakage of electric charges from the capacitor 12 after the operation. For example, the operation for obtaining the threshold voltage can be carried out once in ten or more frames. For example, the operation for obtaining the threshold voltage is carried out once in 3600 or more frames. The operation for obtaining the threshold voltage can be carried out once in one or more minutes. Thus, the power consumption of the display device can be reduced without reducing the display quality.

This embodiment can be implemented combining with any of the other embodiments as appropriate.

(Embodiment 5)

In this embodiment, one mode of a specific structure of a display device including the pixel 100 shown in any of FIG. 1A, FIG. 2A, FIG. 3A, and FIG. 4A will be described.

Figure 5:
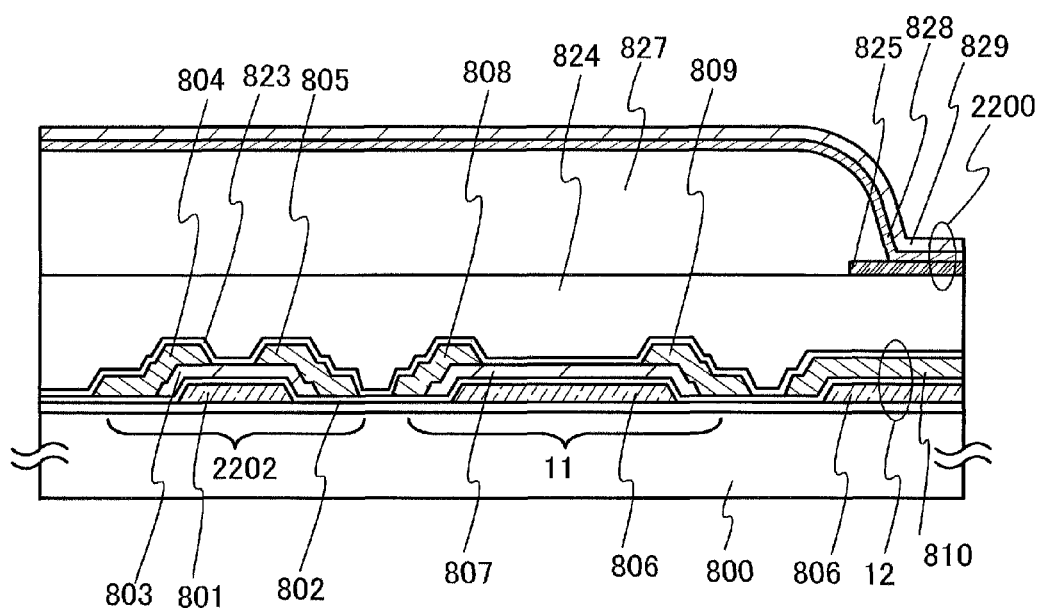
FIG. 5 is a cross-sectional view of a structure of a display device.

FIG. 5 is a cross-sectional view showing the structure of the display device. In FIG. 5, a transistor 2202 included in the switch 203, the transistor 11, the capacitor 12, an EL element 2200 used as the load element 200 are typically shown. Other switches can each have a structure similar to that of the transistor 2202 or the transistor 11.

The transistor 2202 includes a conductive layer 801 functioning as a gate, a gate insulating film 802 over the conductive layer 801, a semiconductor layer 803 positioned over the gate insulating film 802 to overlap with the conductive layer 801, and conductive layers 804 and 805 positioned over the semiconductor layer 803 and functioning as a source and a drain, which are provided over a substrate 800 having an insulating surface.

The transistor 11 includes a conductive layer 806 functioning as a gate, the gate insulating film 802 over the conductive layer 806, a semiconductor layer 807 positioned over the gate insulating film 802 to overlap with the conductive layer 806, and conductive layers 808 and 809 positioned over the semiconductor layer 807 and functioning as a source and a drain, which are provided over the substrate 800 having an insulating surface.

The capacitor 12 includes the conductive layer 806, the gate insulating film 802 over the conductive layer 806, and a conductive layer 810 positioned over the gate insulating film 802 to overlap with the conductive layer 806, which are provided over the substrate 800 having an insulating surface.

An insulating film 823 and an insulating film 824 are formed in this order over the conductive layers 804, 805, 808, 809, and 810. A conductive layer 825 functioning as an anode is formed over the insulating film 824.

In addition, an insulating layer 827 having an opening where part of the conductive layer 825 is exposed is provided over the insulating film 824. An electroluminescent layer 828 and a conductive layer 829 functioning as a cathode are stacked in this order over the part of the conductive layer 825 and the insulating layer 827. A region where the conductive layer 825, the electroluminescent layer 828, and the conductive layer 829 overlap with one another corresponds to the EL element 2200.

An oxide semiconductor layer can be used as the semiconductor layer 803. With the use of an oxide semiconductor layer as the semiconductor layer 803, an off-state current of the transistor 2202 can be extremely small. Thus, the frequency of the operation of obtaining threshold voltage can be further reduced by suppressing leakage of electric charges from the capacitor 12 after the operation. For example, the operation for obtaining the threshold voltage can be carried out once in ten or more frames. For example, the operation for obtaining the threshold voltage is carried out once in 3600 or more frames. The operation for obtaining the threshold voltage can be carried out once in one or more minutes. Consequently, the power consumption of the display device can be reduced without reducing the display quality.

This embodiment can be implemented combining with any of other embodiments as appropriate.

(Embodiment 6)

In this embodiment, a more specific structure of the display device in Embodiment 5 with reference to FIG. 5 will be described.

A structure in which the semiconductor layers 803 and 807 shown in FIG. 5 are formed using oxide semiconductor layers will be described.

An oxide semiconductor to be used preferably contains at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In: Ga: Zn. The In—Ga—Zn-based oxide may contain a metal element other than the In, Ga, and Zn.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

Note that for example, the expression "the composition of an oxide including In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

Note that it is preferable that impurities such as moisture or hydrogen serving as an electron donor (donor) in the oxide semiconductor layer be reduced. Specifically, the concentration of hydrogen in the oxide semiconductor layer that is measured by secondary ion mass spectrometry (SIMS) is $5 \times 10^{19}/cm^3$ or lower, preferably $5 \times 10^{18}/cm^3$ or lower, more preferably $5 \times 10^{17}/cm^3$ or lower, still more preferably $1 \times 10^{16}/cm^3$ or lower.

Here, an analysis on the concentration of hydrogen in the oxide semiconductor layer will be mentioned. Note that the concentration of hydrogen in a semiconductor layer is measured by secondary ion mass spectrometry. The SIMS analysis is known for having difficulty in obtaining accurate data in the proximity of a surface of a sample or in the proximity of an interface between stacked layers formed using different materials because of its principle. Thus, in the case where the distribution of the concentration of hydrogen in the layer in a thickness direction is analyzed by SIMS, an average value in a region of the layer in which the value is not greatly changed and is practically constant can be obtained is employed as the concentration of hydrogen. Further, in the case where the thickness of the layer is small, a region where a practically constant value can be obtained cannot be found in some cases due to the influence of the concentration of hydrogen in the layers adjacent to each other. In that case, the maximum value or the minimum value of the concentration of hydrogen in the region of the layer is employed as the concentration of hydrogen in the layer. Further, in the case where a mountain-shaped peak having the maximum value or a valley-shaped peak having the minimum value do not exist in the region of the layer, the value at the inflection point is employed as the concentration of hydrogen.

The oxide semiconductor layer can be formed in such a manner that an oxide semiconductor film formed over the substrate 800 having an insulating surface is etched. The thickness of the oxide semiconductor film is 2 nm or longer and 200 nm or shorter, preferably 3 nm or longer and 50 nm or shorter, more preferably 3 nm or longer and 20 nm or shorter. The oxide semiconductor film is formed by a sputtering method using an oxide semiconductor as a target. In addition, the oxide semiconductor film can be formed by a sputtering method in a rare gas (e.g., argon) atmosphere, an oxygen atmosphere, or a mixed atmosphere including a rare gas (e.g., argon) and oxygen.

In the case of using an In—Sn—Zn—O-based material for the oxide semiconductor, an oxide target which has a composition ratio of In:Sn:Zn=1:2:2, 2:1:3, 1:1:1, or 20:45:35 in an atomic ratio can be used.

In the case of using an In—Zn—O-based material for an oxide semiconductor, a target has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$: ZnO=10:1 to 1:2 in a molar ratio), further preferably, In:Zn=1.5:1 to 15:1 in an atomic ratio ($In_2O_3$: ZnO=15:2 to 3:4 in a molar ratio). For example, an oxide target having an atomic ratio of In:Zn:O=X:Y:Z which satisfies Z>1.5X+Y can be used.

In the case where the oxide semiconductor film is formed by a sputtering method, it is important to reduce not only the concentration of hydrogen of a target but also water and hydrogen in a chamber, as much as possible. Specifically, for example, it is effective to perform baking of the chamber before formation of the oxide semiconductor layer, to reduce the concentration of water and hydrogen in a gas introduced into the chamber, and to prevent the counter flow in an evacuation system for exhausting a gas from the chamber.

Note that before the oxide semiconductor film is formed by a sputtering method, dust on a surface over which the oxide semiconductor film is formed is preferably removed by reverse sputtering in which an argon gas is introduced and plasma is generated. The reverse sputtering is a method in which voltage is applied to a substrate, not to a target side, under an argon atmosphere by using an RF power supply and plasma is generated in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

In order that hydrogen, a hydroxyl group, and moisture be contained in the oxide semiconductor film as little as possible, it is preferable that impurities adsorbed on the substrate 800, such as moisture or hydrogen, be eliminated and removed by preheating the substrate 800 in a preheating chamber of a sputtering apparatus, as a pretreatment for film formation. The temperature for the preheating is higher than or equal to 100° C. and lower than or equal to 400° C., preferably higher than or equal to 150° C. and lower than or equal to 300° C. As an evacuation means, a cryopump is preferably provided in the preheating chamber. Note that this preheating treatment can be omitted.

For example, a 30-nm-thick In—Ga—Zn-based oxide semiconductor thin film which is obtained by a sputtering method using a target including indium (In), gallium (Ga), and zinc (Zn) is used as the oxide semiconductor film. As the target, a target having a composition ratio of In:Ga:Zn=1:1:0.5, In:Ga:Zn=1:1:1, or In:Ga:Zn=1:1:2 can be used, for example. The relative density of the target including In, Ga, and Zn is greater than or equal to 90% and less than or equal to 100%, preferably greater than or equal to 95% and less than 100%. With the use of the target with high relative density, a dense oxide semiconductor film is formed.

For example, the oxide semiconductor film is formed in such a manner that the substrate is held in the treatment chamber kept at reduced pressure, a sputtering gas from which hydrogen and moisture have been removed is introduced into the treatment chamber while moisture remaining therein is removed, and the above-described target is used. The substrate temperature may be higher than or equal to 100° C. and lower than or equal to 600° C., preferably higher than or equal to 200° C. and lower than or equal to 400° C. in film formation. By forming the oxide semiconductor film in a state where the substrate is heated, the concentration of impurities included in the formed oxide semiconductor film can be reduced. In addition, damage due to sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, for example, a hydrogen atom, a compound containing a hydrogen atom, such as water ($H_2O$), (more preferably, also a compound containing a carbon atom), and the like are removed, whereby the concentration of impurities in the oxide semiconductor film formed in the treatment chamber can be reduced.

As one example of the film formation condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current (DC) power supply is preferable because dust generated in film formation can be reduced and the film thickness can be made uniform.

In addition, when the leakage rate of the treatment chamber of the sputtering apparatus is set to lower than or equal to $1 \times 10^{-10}$ Pa·m$^3$/second, entry of impurities such as an alkali metal or hydride into the oxide semiconductor film that is being formed by a sputtering method can be reduced. Further, with the use of an entrapment vacuum pump as an exhaustion system, counter flow of impurities, such as alkali metal, hydrogen atoms, hydrogen molecules, water, a hydroxyl group, or hydride, from the exhaustion system can be reduced.

When the purity of the target is set to 99.99% or higher, alkali metal, hydrogen atoms, hydrogen molecules, water, a hydroxyl group, hydride, or the like mixed to the oxide semiconductor film can be reduced. In addition, when the target is used, the concentration of alkali metal such as lithium, sodium, or potassium can be reduced in the oxide semiconductor film.

Note that it has been pointed out that an oxide semiconductor is insensitive to impurities, there is no problem when a considerable amount of metal impurities is contained in the film, and therefore, soda-lime glass which contains a large amount of alkali metal such as sodium (Na) and is inexpensive can also be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). However, such consideration is not appropriate. Alkali metal is not an element included in an oxide semiconductor, and therefore, is an impurity. In addition, alkaline earth metal is an impurity in the case where alkaline earth metal is not included in an oxide semiconductor. Alkali metal, in particular, Na becomes Na$^+$ when an insulating film in contact with the oxide semiconductor layer is an oxide and Na diffuses into the insulating film. Further, in the oxide semiconductor layer, Na cuts or enters a bond between a metal and oxygen which are included in an oxide semiconductor. As a result, for example, deterioration of characteristics of the transistor, such as a normally-on state of the transistor due to shift of a threshold voltage in the negative direction, or reduction in mobility, occurs. In addition, variations in characteristics also occur. Such deterioration of characteristics of the transistor and variations in characteristics due to the impurity remarkably appear when the concentration of hydrogen in the oxide semiconductor layer is very low. Therefore, the concentration of the above impurity is preferably reduced when the concentration of hydrogen in the oxide semiconductor layer is less than or equal to $1 \times 10^{18}$/cm$^3$, preferably less than or equal to $1 \times 10^{17}$/cm$^3$. Specifically, a measurement value of a Na concentration by secondary ion mass spectrometry is preferably less than or equal to $5 \times 10^{16}$/cm$^3$, more preferably less than or equal to $1 \times 10^{16}$/cm$^3$, still more preferably less than or equal to $1 \times 10^{15}$/cm$^3$. In a similar manner, a measurement value of a Li concentration is preferably less than or equal to $5 \times 10^{15}$/cm$^3$, more preferably less than or equal to $1 \times 10^{15}$/cm$^3$. In a similar manner, a measurement value of a K concentration is preferably less than or equal to $5 \times 10^{15}$/cm$^3$, more preferably less than or equal to $1 \times 10^{15}$/cm$^3$.

An oxide semiconductor film can be in a single crystal state, a polycrystalline (also referred to as polycrystal) state, an amorphous state, or the like.

The oxide semiconductor film is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal parts and amorphous parts are included. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility due to the grain boundary is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

Note that part of oxygen included in the oxide semiconductor film may be substituted with nitrogen.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor layer in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

Note that, $R_a$ is obtained by three-dimension expansion of center line average roughness that is defined by JIS B 0601 so as to be applied to a plane. The $R_a$ can be expressed as an "average value of the absolute values of deviations from a reference surface to a specific surface" and is defined by the formula below.

$$Ra = \frac{1}{S_0} \int_{y_1}^{y_2} \int_{x_1}^{x_2} |f(x, y) - Z_0| dx dy \qquad \text{[Formula 1]}$$

In the above formula, $S_0$ represents an area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. Ra can be measured using an atomic force microscope (AFM).

A CAAC-OS film can be formed by sputtering. The above material can be used as a target material. In the case where the CAAC-OS film is formed by a sputtering method, the proportion of an oxygen gas in an atmosphere is preferably high. In the case where sputtering is performed in a mixed gas of argon and oxygen, for example, the proportion of an oxygen gas is preferably 30% or higher, more preferably 40% or higher because supply of oxygen from the atmosphere promotes crystallization of the CAAC-OS film.

In the case where the CAAC-OS film is formed by a sputtering method, a substrate over which the CAAC-OS film is formed is heated preferably to 150° C. or higher, more preferably to 170° C. or higher. This is because the higher the substrate temperature becomes, the more crystallization of the CAAC-OS film is promoted.

After heat treatment is performed on the CAAC-OS film in a nitrogen atmosphere or in vacuum, heat treatment is preferably performed in an oxygen atmosphere or a mixed gas of oxygen and another gas. This is because oxygen deficiency (or oxygen defects) due to the former heat treatment can be reduced by supply of oxygen from the atmosphere in the latter heat treatment.

A film surface on which the CAAC-OS film is formed (deposition surface) is preferably flat. This is because roughness of the deposition surface leads to generation of grain boundaries in the CAAC-OS film because the c-axis approximately perpendicular to the deposition surface exists in the CAAC-OS film. For this reason, the deposition surface is preferably subjected to planarization treatment such as chemical mechanical polishing (CMP) before the CAAC-OS film is deposited. The average roughness of the deposition surface is preferably 0.5 nm or less, more preferably 0.3 nm or less.

Note that an oxide semiconductor film formed by a sputtering method or the like contains moisture or hydrogen (including a hydroxyl group) as impurities in some cases. In one embodiment of the present invention, in order to reduce impurities such as moisture or hydrogen in the oxide semiconductor film (in order to perform dehydration or dehydrogenation), heat treatment is performed on the oxide semiconductor film in a reduced-pressure atmosphere, an inert gas atmosphere of nitrogen, a rare gas, or the like, an oxygen gas atmosphere, or ultra dry air (the moisture amount is 20 ppm (−55° C. by conversion into a dew point) or less, preferably 1 ppm or less, more preferably 10 ppb or less, in the case where measurement is performed by a dew point meter in a cavity ring-down laser spectroscopy (CRDS) method).

Heat treatment can eliminate moisture or hydrogen in the oxide semiconductor film. Specifically, the heat treatment may be performed at temperature higher than or equal to 250° C. and lower than or equal to 750° C., preferably higher than or equal to 400° C. and lower than the strain point of a substrate. For example, the heat treatment may be performed at 500° C. for 3 minutes or longer and 6 minutes or shorter. When RTA is used for the heat treatment, dehydration or dehydrogenation can be performed in a short time; thus, treatment can be performed even at temperature higher than the strain point of a glass substrate.

In this embodiment, an electrical furnace that is one of heat treatment apparatuses is used.

Note that the heat treatment apparatus is not limited to an electric furnace, and may have a device for heating an object to be processed by heat conduction or heat radiation from a heating element such as a resistance heating element. For example, an RTA (rapid thermal annealing) apparatus such as a GRTA (gas rapid thermal annealing) apparatus, or an LRTA (lamp rapid thermal annealing) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, like nitrogen or a rare gas such as argon is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably greater than or equal to 6 N (99.9999%), more preferably greater than or equal to 7 N (99.99999%) (i.e., the impurity concentration is preferably less than or equal to 1 ppm, more preferably less than or equal to 0.1 ppm).

Through the above steps, the concentration of hydrogen in the oxide semiconductor film can be reduced.

After moisture or hydrogen in the oxide semiconductor film is eliminated in such a manner, oxygen is added (supplied) to the oxide semiconductor film (or an oxide semiconductor layer formed using the oxide semiconductor film). Thus, oxygen defects in the oxide semiconductor film (oxide semiconductor layer), at the interface, or the like is reduced, so that the oxide semiconductor layer can be an i-type or substantially i-type oxide semiconductor layer.

The addition of oxygen can be performed in such a manner that an insulating film including a region where the amount of oxygen is greater than that in the stoichiometric composition ratio is formed in contact with the oxide semiconductor film (or the oxide semiconductor layer formed using the oxide semiconductor film), and then heated. In such a manner, excessive oxygen in the insulating film can be supplied to the oxide semiconductor film (oxide semiconductor layer). Thus, the oxide semiconductor film (oxide semiconductor layer) can contain oxygen excessively. Oxygen contained excessively exists, for example, between lattices of a crystal included in the oxide semiconductor film (oxide semiconductor layer).

Note that the insulating film including a region where the amount of oxygen is greater than that in the stoichiometric composition ratio may be used for either the insulating film positioned on the upper side of the oxide semiconductor film (oxide semiconductor layer) or the insulating film positioned on the lower side of the oxide semiconductor film (oxide semiconductor layer) of the insulating films in contact with the oxide semiconductor film (oxide semiconductor layer); however, it is preferable to use such an insulating film to both of the insulating films in contact with the oxide semiconductor film (oxide semiconductor layer). The above-described effect can be enhanced with a structure, in which the insulating films each including a region where the amount of oxygen is greater than that in the stoichiometric composition ratio are used as the insulating films in contact with the oxide semiconductor film (oxide semiconductor layer) and positioned on the upper side and the lower side of the oxide semiconductor film (oxide semiconductor layer) so that the oxide semiconductor film (oxide semiconductor layer) is provided between the insulating films.

Here, the insulating film including a region where the amount of oxygen is greater than that in the stoichiometric composition ratio may be a single-layer insulating film or a plurality of insulating films which are stacked. Note that it is preferable that the insulating film include impurities such as moisture and hydrogen as little as possible. When hydrogen is contained in the insulating film, entry of the hydrogen to the oxide semiconductor film (oxide semiconductor layer) or extraction of oxygen from the oxide semiconductor film (oxide semiconductor layer) by the hydrogen occurs, whereby the oxide semiconductor film has lower resistance (has n-type conductivity); thus, a parasitic channel might be formed. Therefore, it is important that a film formation method in which hydrogen is not used be employed in order to form the insulating film containing as little hydrogen as possible. In addition, a material having a high barrier property is preferably used for the insulating film. For example, a silicon nitride film, a silicon nitride oxide film, an aluminum nitride film, an aluminum oxide film, an aluminum nitride oxide film, or the like can be used as the insulating film having a high barrier property. In the case of using a plurality of insulating films which are stacked, an insulating film having a lower proportion of nitrogen such as a silicon oxide film or a silicon oxynitride film is formed to be closer to the oxide semiconductor film (oxide semiconductor layer) than the insulating film having high barrier property. Then, the insulating film having a high barrier property is formed to overlap with the oxide semiconductor film (oxide semiconductor layer) with the insulating film having a lower proportion of nitrogen provided therebetween. With the use of the insulating film having a high barrier property, impurities such as moisture or hydrogen can be prevented from entering the oxide semiconductor film (oxide semiconductor layer), the interface between the oxide semiconductor film and another insulating film, and the vicinity thereof. In addition, the insulating film having lower proportion of nitrogen such as a silicon oxide film or a silicon oxynitride film is formed to be in contact with the oxide semiconductor film (oxide semiconductor layer), so that the insulating film formed using a material having a high barrier property can be prevented from being in contact with the oxide semiconductor film (oxide semiconductor layer) directly.

Alternatively, the addition of oxygen after moisture or hydrogen in the oxide semiconductor film (oxide semiconductor layer) is eliminated may be performed by heat treatment on the oxide semiconductor film (oxide semiconductor layer) in an oxygen atmosphere. It is preferable that an oxygen gas used for the heat treatment under an oxygen atmosphere do not include water, hydrogen, or the like. Alternatively, the purity of the oxygen gas which is introduced into the heat treatment apparatus is preferably greater than or equal to 6N (99.9999%), further preferably greater than or equal to 7N (99.99999%) (that is, the impurity concentration in the oxygen gas is less than or equal to 1 ppm, preferably less than or equal to 0.1 ppm).

Further alternatively, the addition of oxygen after moisture or hydrogen in the oxide semiconductor film (oxide semiconductor layer) is eliminated may be performed by an ion implantation method or an ion doping method. For example, oxygen made to be plasma with a microwave of 2.45 GHz may be added to the oxide semiconductor film (oxide semiconductor layer).

The oxide semiconductor film formed as described above is etched so that the oxide semiconductor layer is formed and used as the semiconductor layer 803 and the semiconductor layer 807.

Note that an insulating material containing an element that belongs to Group 13 and oxygen may be used for the insulating film (the gate insulating film 802 and the insulating film 823 in FIG. 5) which is in contact with the semiconductor layer 803 and the semiconductor layer 807 formed using the oxide semiconductor layer. Many of oxide semiconductor materials contain elements that belong to Group 13, and an insulating material containing an element of Group 13 is compatible with an oxide semiconductor. Thus, when an insulating material containing an element that belongs to Group 13 is used for the insulating film in contact with the oxide semiconductor layer, the state of the interface between the oxide semiconductor layer and the insulating film can be kept favorable.

An insulating material containing an element that belongs to Group 13 is an insulating material containing one or more elements that belong to Group 13. As the insulating material containing an element that belongs to Group 13, a gallium oxide, an aluminum oxide, an aluminum gallium oxide, a gallium aluminum oxide, and the like are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, when a material containing gallium oxide is used for an insulating film that is in contact with an oxide semiconductor layer containing gallium, characteristics at the interface between the oxide semiconductor layer and the insulating film can be kept favorable. For example, the oxide semiconductor layer and an insulating film containing gallium oxide are provided in contact with each other, so that pile up of hydrogen at the interface between the oxide semiconductor layer and the insulating film can be reduced. Note that a similar effect can be obtained in the case where an element in the same group as a constituent element of the oxide semiconductor is used in an insulating film. For example, it is effective to form an insulating film with the use of a material containing aluminum oxide. Note that water is less likely to permeate an aluminum oxide. Thus, it is preferable to use a material containing an aluminum oxide in terms of preventing entry of water to the oxide semiconductor layer.

The insulating material of the insulating film in contact with the semiconductor layers 803 and 807 which are formed using the oxide semiconductor layer preferably contains oxygen in a proportion higher than that in the stoichiometric composition by heat treatment in an oxygen atmosphere or by oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen in the form of plasma is added to a bulk. The oxygen doping may be performed by an ion implantation method or an ion doping method.

For example, in the case where gallium oxide is used for the insulating film in contact with the semiconductor layers 803 and 807 which are formed using the oxide semiconductor layer, the composition of gallium oxide can be set to be $Ga_2O_x$ ($x=3+\alpha$, $0<\alpha<1$) by heat treatment in an oxygen atmosphere or by oxygen doping.

In the case where aluminum oxide is used for the insulating film in contact with the semiconductor layers 803 and 807 which are formed using the oxide semiconductor layer, the composition of aluminum oxide can be set to be $Al_2O_x$ ($x=3+\alpha$, $0<\alpha<1$) by heat treatment in an oxygen atmosphere or by oxygen doping.

In the case where gallium aluminum oxide (aluminum gallium oxide) is used for the insulating film in contact with the semiconductor layers 803 and 807 which are formed using the oxide semiconductor layer, the composition of gallium aluminum oxide (aluminum gallium oxide) can be set to be $Ga_xAl_{2-x}O_{3+\alpha}$ ($0<x<2$, $0<\alpha<1$) by heat treatment in an oxygen atmosphere or by oxygen doping.

By oxygen doping, an insulating film including a region where the amount of oxygen is greater than that in the stoichiometric composition ratio can be formed. When the insulating film including such a region is in contact with the oxide semiconductor layer, excess oxygen in the insulating film is supplied to the oxide semiconductor layer, and oxygen defects in the oxide semiconductor layer or at the interface between the oxide semiconductor layer and the insulating film are reduced. Thus, the oxide semiconductor layer can be made to be an i-type or substantially i-type oxide semiconductor.

The insulating film including a region where the amount of oxygen is greater than that in the stoichiometric composition ratio may be used for either the insulating film positioned on an upper side of the semiconductor layers 803 and 807 or the insulating film positioned on a lower side of the semiconductor layers 803 and 807 of the insulating films in contact with the semiconductor layers 803 and 807 which are formed using the oxide semiconductor layer; however, it is preferable to use such an insulating film for both the insulating films which are in contact with the semiconductor layers 803 and 807. The above-described effect can be enhanced with a structure, in which the insulating films each including a region where the amount of oxygen is greater than that in the stoichiometric composition ratio are used as the insulating films in contact with the semiconductor layers 803 and 807 and positioned on the upper side and the lower side of the semiconductor layers 803 and 807 so that the semiconductor layers 803 and 807 is provided between the insulating films.

The insulating films on the upper side and the lower side of the semiconductor layers 803 and 807 which are formed using the oxide semiconductor layer may include the same constituent elements or different constituent elements. For example, the insulating films on the upper side and the lower side may be both formed of gallium oxide whose composition is $Ga_2O_x$ ($x=3+\alpha$, $0<\alpha<1$). Alternatively, one of the insulating films on the upper side and the lower side may be formed of gallium oxide whose composition is $Ga_2O_x$ ($x=3+\alpha$, $0<\alpha<1$) and the other may be formed of aluminum oxide whose composition is $Al_2O_x$ ($x=3+\alpha$, $0<\alpha<1$).

The insulating film in contact with the semiconductor layers 803 and 807 which are formed using the oxide semiconductor layer may be a stack of insulating films each of which includes a region where the amount of oxygen is greater than that in the stoichiometric composition ratio. For example, the insulating layer on the upper side of the semiconductor layers 803 and 807 which are formed using the oxide semiconductor layer may be formed as follows: gallium oxide whose composition is $Ga_2O_x$ ($x=3+\alpha$, $0<\alpha<1$) is formed and gallium aluminum oxide (aluminum gallium oxide) whose composition is $Ga_xAl_{2-x}O_{3+\alpha}$ ($0<x<2$, $0<\alpha<1$) may be formed there-over. Further, both of the insulating films on the upper side and the lower side of the semiconductor layers 803 and 807 which are formed using the oxide semiconductor layer may be formed by stacking insulating films each including a region where the amount of oxygen is greater than that in the stoichiometric composition ratio.

This embodiment can be implemented combining with any of the above-described embodiments as appropriate.
(Embodiment 7)

In this embodiment, a CAAC-OS film will be described.

An example of a crystalline structure included in the CAAC-OS film will be described in detail with reference to FIGS. 6A to 6E, FIGS. 7A to 7C, and FIGS. 8A to 8C. In FIGS. 6A to 6E, FIGS. 7A to 7C, and FIGS. 8A to 8C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 6A to 6E, O surrounded by a circle represents a tetracoordinate O atom and a double circle represents a tricoordinate O atom.

Figure 6A:
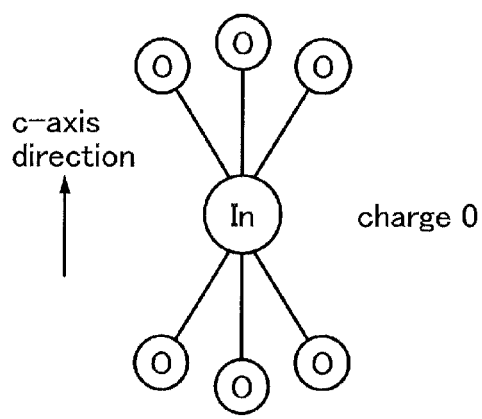
FIGS. 6A to 6E are diagrams of crystalline structures of an oxide semiconductor layer.

FIG. 6A shows a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 6A is actually an octahedral structure, but is shown as a planar structure for simplicity. Note that three tetracoordinate O atoms exist in each of an upper half and a lower half in FIG. 6A. In the small group shown in FIG. 6A, charge is 0.

Figure 6D:
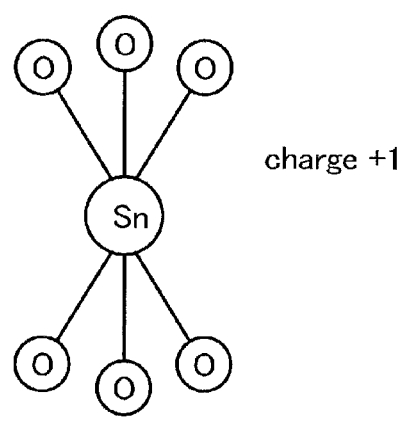
Figure 6B:
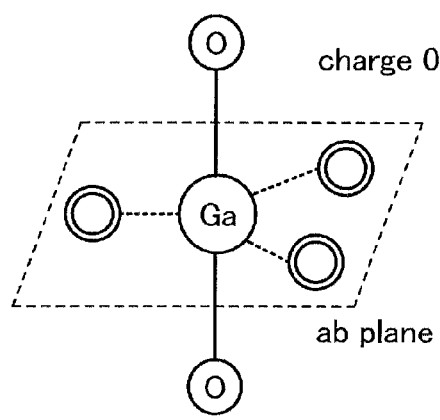

FIG. 6B shows a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 6B. An In atom can also have the structure shown in FIG. 6B because an In atom can have five ligands. In the small group shown in FIG. 6B, charge is 0.

Figure 6E:
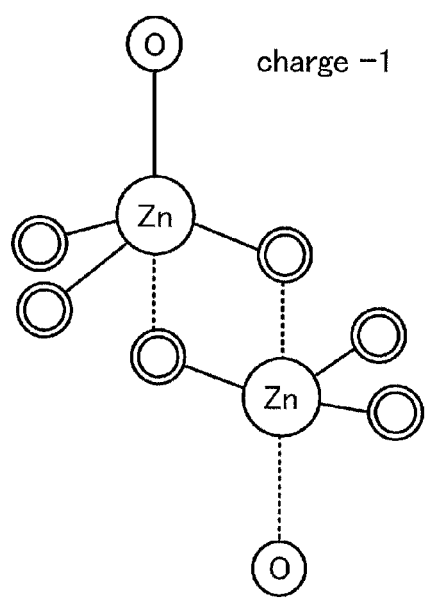
Figure 6C:
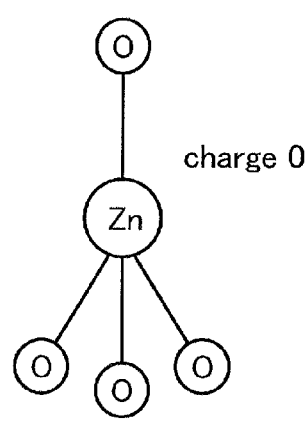

FIG. 6C shows a structure including one tetracoordinate Zn atom and four tetracoordinate O atoms proximate to the Zn atom. In FIG. 6C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 6C. In the small group shown in FIG. 6C, charge is 0.

FIG. 6D shows a structure including one hexacoordinate Sn atom and six tetracoordinate O atoms proximate to the Sn atom. In FIG. 6D, three tetracoordinate O atoms exist in each of an upper half and a lower half In the small group shown in FIG. 6D, charge is +1.

FIG. 6E shows a small group including two Zn atoms. In FIG. 6E, one tetracoordinate O atom exists in each of an upper half and a lower half In the small group shown in FIG. 6E, charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 6A each have three proximate In atoms in the downward direction, and the three O atoms in the lower half each have three proximate In atoms in the upward direction. The one O atom in the upper half with respect to the pentacoordinate Ga atom in FIG. 6B has one proximate Ga atom in the downward direction, and the one O atom in the lower half has one proximate Ga atom in the upward direction. The one O atom in the upper half with respect to the tetracoordinate Zn atom in FIG. 6C has one proximate Zn atom in the downward direction, and the three O atoms in the lower half each have three proximate Zn atoms in the upward direction. Similarly, the number of the tetracoordinate O atoms below the metal atom is equal to the number of the metal atoms proximate to and above each of the tetracoordinate O atoms. Since the coordination number of the tetracoordinate O atom is four, the sum of the number of the metal atoms proximate to and below the O atom and the number of the metal atoms proximate to and above the O atom is four. Therefore, when the sum of the number of tetracoordinate O atoms above a metal atom and the number of tetracoordinate O atoms below another metal atom is four, the two kinds of small groups including the metal atoms can be bonded. For example, in the case where the hexacoordinate metal (In or Sn) atom is bonded through three tetracoordinate O atoms in the upper half, it is bonded to the pentacoordinate metal (Ga or In) atom or the tetracoordinate metal (Zn) atom.

A metal atom having the above coordination number is bonded to another metal atom having the above coordination number through a tetracoordinate O atom in the c-axis direction. In addition to the above, a medium group can be formed in a different manner by combining a plurality of small groups so that the total charge of the layered structure is 0.

Figure 7A:
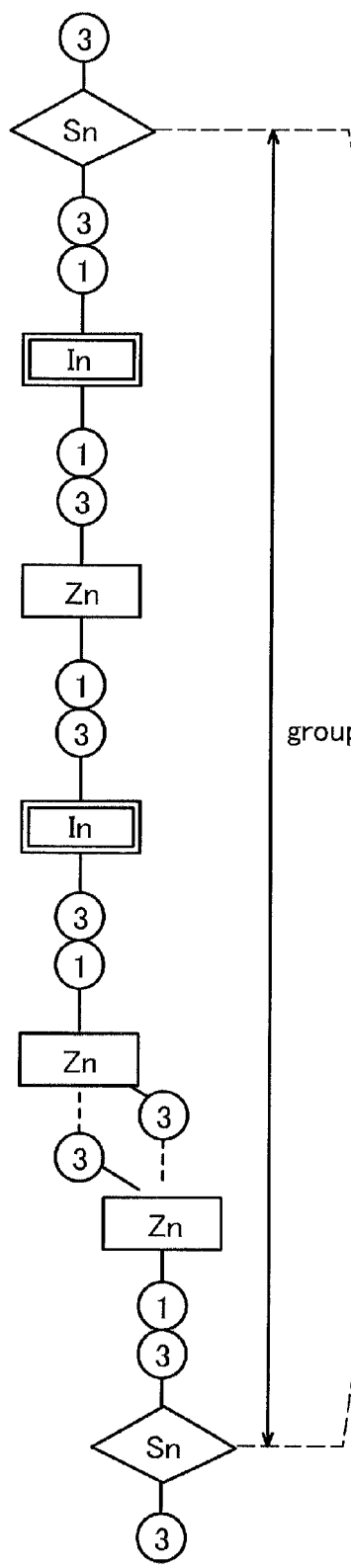
FIGS. 7A to 7C are diagrams of a crystalline structure of an oxide semiconductor layer.
Figure 7B:
Figure 7C:
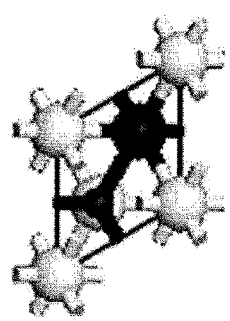

FIG. 7A shows a model of a medium group included in a layered structure of an In—Sn—Zn—O system. FIG. 7B shows a large group including three medium groups. Note that FIG. 7C shows an atomic arrangement in the case where the layered structure in FIG. 7B is observed from the c-axis direction.

In FIG. 7A, for simplicity, a tricoordinate O atom is omitted and tetracoordinate O atoms are shown by a circle; the number in the circle shows the number of tetracoordinate O atoms. For example, three tetracoordinate O atoms existing in each of an upper half and a lower half with respect to a Sn atom are denoted by circled 3. Similarly, in FIG. 7A, one tetracoordinate O atom existing in each of an upper half and a lower half with respect to an In atom is denoted by circled 1. FIG. 7A also shows a Zn atom proximate to three tetracoordinate O atoms in an upper half and one tetracoordinate O atom in a lower half, and a Zn atom proximate to one tetracoordinate O atom in an upper half and three tetracoordinate O atoms in a lower half.

In the medium group included in the layered structure of an In—Sn—Zn—O system in FIG. 7A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, charge for one bond of a tricoordinate O atom and charge for one bond of a tetracoordinate O atom can be assumed to be −0.667 and −0.5, respectively. For example, charge of a (hexacoordinate or pentacoordinate) In atom, charge of a (tetracoordinate) Zn atom, and charge of a (pentacoordinate or hexacoordinate) Sn atom are +3, +2, and +4, respectively. Accordingly, charge in a small group including a Sn atom is +1. Therefore, charge of −1, which cancels +1, is needed to form a layered structure including a Sn atom. As a structure having charge of −1, the small group including two Zn atoms as shown in FIG. 6E can be given. For example, with one small group including two Zn atoms, charge of one small group including a Sn atom can be cancelled, so that the total charge of the layered structure can be 0.

When the large group shown in FIG. 7B is repeated, a crystal of an In—Sn—Zn—O system ($In_2SnZn_3O_8$) can be obtained. Note that the layered structure of an In—Sn—Zn—O system which is obtained can be expressed as a composition formula, $In_2SnZn_2O_7(ZnO)_m$ (m is 0 or a natural number).

The above-described rule also applies to the following oxides: a four-component metal oxide such as an In—Sn—Ga—Zn—O system oxide; a three-component metal oxide such as an In—Ga—Zn—O system oxide (also referred to as IGZO), an In—Al—Zn—O system oxide, a Sn—Ga—Zn—O system oxide, an Al—Ga—Zn—O system oxide, a Sn—Al—Zn—O system oxide, an In—Hf—Zn—O system oxide, an In—La—Zn—O system oxide, an In—Ce—Zn—O system oxide, an In—Pr—Zn—O system oxide, an In—Nd—Zn—O system oxide, an In—Sm—Zn—O system oxide, an In—Eu—Zn—O system oxide, an In—Gd—Zn—O system oxide, an In—Tb—Zn—O system oxide, an In—Dy—Zn—O system oxide, an In—Ho—Zn—O system oxide, an In—Er—Zn—O system oxide, an In—Tm—Zn—O system oxide, an In—Yb—Zn—O system oxide, or an In—Lu—Zn—O system oxide; a two-component metal oxide such as an In—Zn—O system oxide, a Sn—Zn—O system oxide, an Al—Zn—O system oxide, a Zn—Mg—O system oxide, a Sn—Mg—O system oxide, an In—Mg—O system oxide, or an In—Ga—O system oxide; and the like.

Figure 8A:
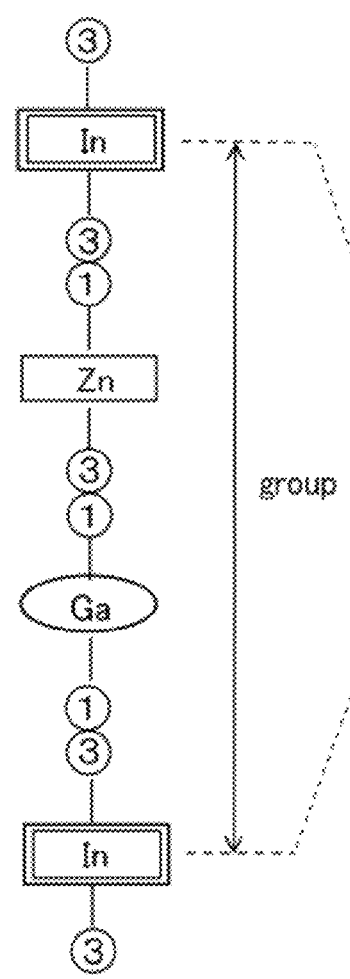
FIGS. 8A to 8C are diagrams of a crystalline structure of an oxide semiconductor layer.

As an example, FIG. 8A shows a model of a medium group included in a layered structure of an In—Ga—Zn—O system.

In the medium group included in the layered structure of an In—Ga—Zn—O system in FIG. 8A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded to form a large group.

Figure 8B:
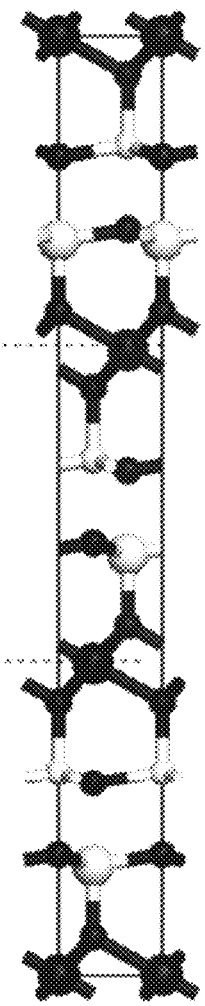
Figure 8C:
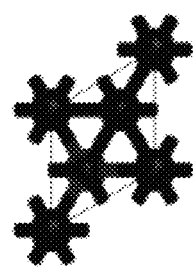

FIG. 8B shows a large group including three medium groups. Note that FIG. 8C shows an atomic arrangement in the case where the layered structure in FIG. 8B is observed from the c-axis direction.

Here, since charge of a (hexacoordinate or pentacoordinate) In atom, charge of a (tetracoordinate) Zn atom, and charge of a (pentacoordinate) Ga atom are +3, +2, +3, respectively, charge of a small group including any of an In atom, a Zn atom, and a Ga atom is 0. As a result, the total charge of a medium group having a combination of such small groups is always 0.

In order to form the layered structure of an In—Ga—Zn—O system, a large group can be formed using not only the medium group shown in FIG. 8A but also a medium group in which the arrangement of the In atom, the Ga atom, and the Zn atom is different from that in FIG. 8A.

This embodiment can be implemented combined with any of the above-described embodiments as appropriate.

(Embodiment 8)

In this embodiment, characteristics of a transistor in which a channel is formed in an oxide semiconductor layer will be described in detail.

A transistor in which a channel is formed in an oxide semiconductor layer containing In, Sn, and Zn as main components can have favorable characteristics by forming the oxide semiconductor film while heating a substrate or by performing heat treatment after the oxide semiconductor film is formed. Note that a main component refers to an element contained in a composition at 5 atomic % or more.

By intentionally heating the substrate after formation of the oxide semiconductor film containing In, Sn, and Zn as main components, the field-effect mobility of the transistor can be improved. Further, the threshold voltage of the transistor can be positively shifted to make the transistor normally off.

Figure 9A:
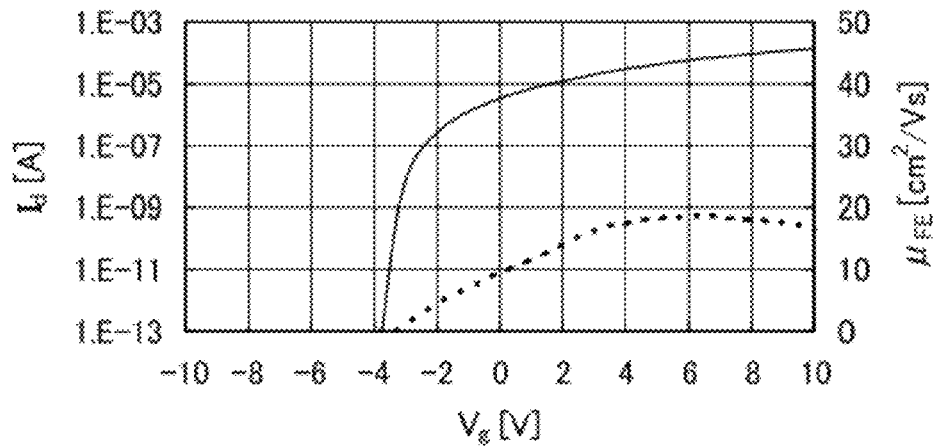
FIGS. 9A to 9C are graphs each showing characteristics of a transistor in which a channel is formed in an oxide semiconductor layer.
Figure 9B:
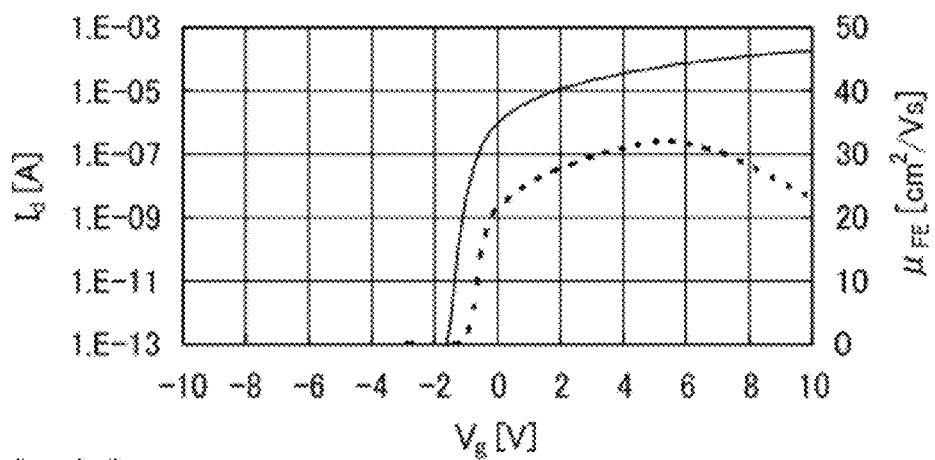
Figure 9C:
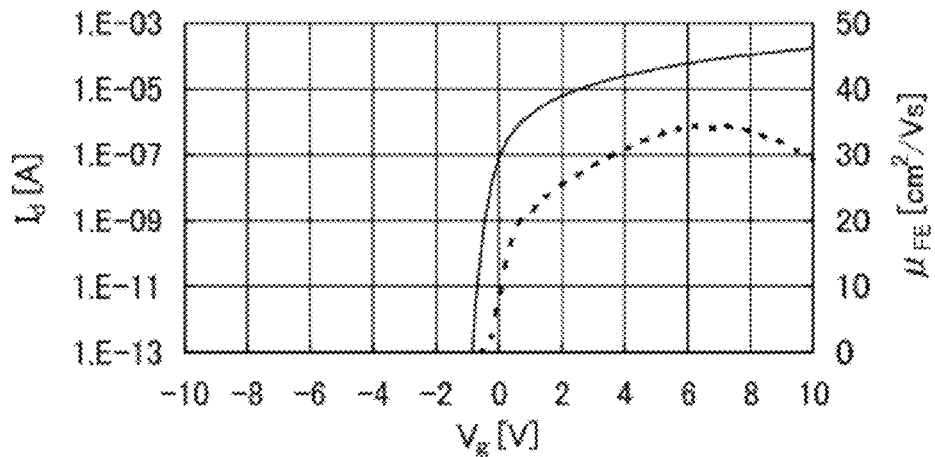

As an example, FIGS. 9A to 9C are graphs each showing characteristics of a transistor in which an oxide semiconductor film containing In, Sn, and Zn as main components and having a channel length L of 3 μm and a channel width W of 10 μm, and a gate insulating film with a thickness of 100 nm are used. Note that $V_d$ was set to 10 V.

FIG. 9A is a graph showing characteristics of a transistor whose oxide semiconductor film containing In, Sn, and Zn as main components was formed by a sputtering method without heating a substrate intentionally. The field-effect mobility of the transistor was 18.8 $cm^2$/Vsec. On the other hand, when the oxide semiconductor film containing In, Sn, and Zn as main components is formed while heating the substrate intentionally, the field-effect mobility can be improved. FIG. 9B shows characteristics of a transistor whose oxide semiconductor film containing In, Sn, and Zn as main components was formed while heating a substrate at 200° C. The field-effect mobility of the transistor was 32.2 $cm^2$/Vsec.

The field-effect mobility can be further improved by performing heat treatment after formation of the oxide semiconductor film containing In, Sn, and Zn as main components. FIG. 9C shows characteristics of a transistor whose oxide semiconductor film containing In, Sn, and Zn as main components was formed by sputtering at 200° C. and then subjected to heat treatment at 650° C. The field-effect mobility of the transistor was 34.5 $cm^2$/Vsec.

The intentional heating of the substrate is expected to have an effect of reducing moisture taken into the oxide semiconductor film during the film formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. In addition, the oxide semiconductor can be crystallized by being highly purified by removal of impurities from the oxide semiconductor. In the case of using such a highly purified non-single-crystal oxide semiconductor, ideally, a field-effect mobility exceeding 100 $cm^2$/Vsec is expected to be realized.

The oxide semiconductor containing In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. A non-single-crystal oxide semiconductor having favorable crystallinity can be obtained by such crystallization treatment or recrystallization treatment.

The intentional heating of the substrate during film formation and/or the heat treatment after the film formation contributes not only to improving field-effect mobility but also to making the transistor normally off. In a transistor in which an oxide semiconductor film which contains In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 9A and 9B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be achieved by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and $V_d$ of 10 V. Note that $V_d$ refers to a drain voltage (a potential difference between the drain and the source). Then, the substrate temperature was set to 150° C. and $V_d$ was set to 0.1 V. After that, $V_g$ of 20 V was applied so that the intensity of an electric field applied to the gate insulating film was 2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a positive BT test.

In a similar manner, first, $V_g$-$I_d$ characteristics of the transistors were measured at a substrate temperature of 25° C. and $V_d$ of 10 V. Then, the substrate temperature was set to 150° C. and $V_d$ was set to 0.1 V. After that, $V_g$ of −20 V was applied so that the intensity of an electric field applied to the gate insulating film was −2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a negative BT test.

Figure 10A:
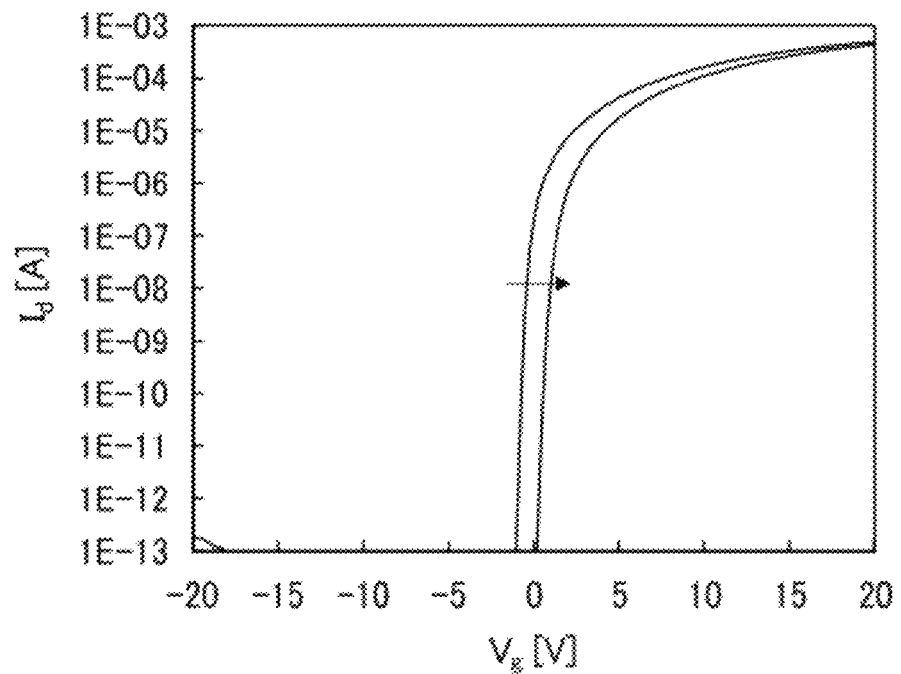
FIGS. 10A and 10B are graphs each showing characteristics of a transistor in which a channel is formed in an oxide semiconductor layer.
Figure 10B:
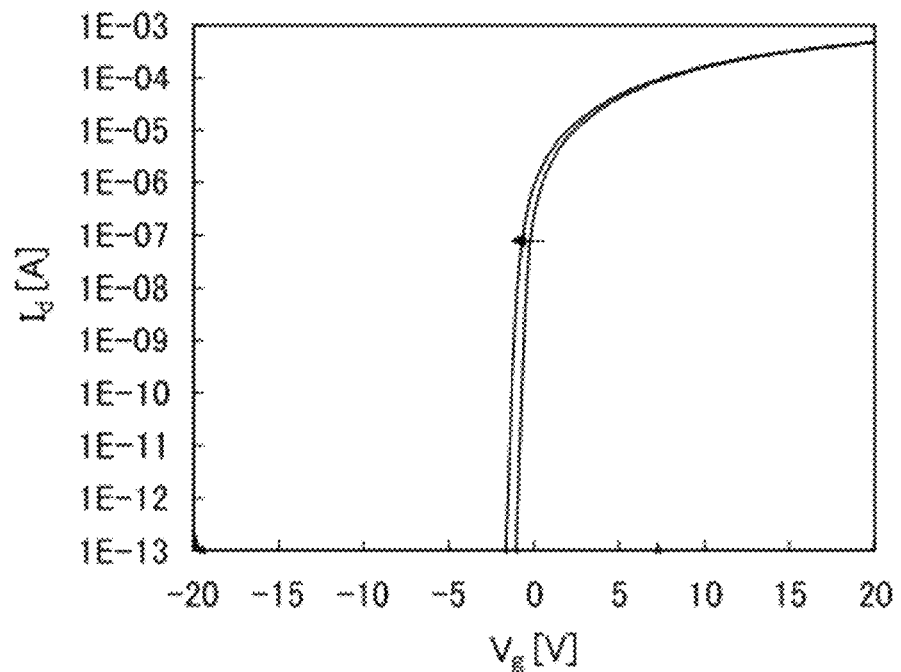
Figure 11A:
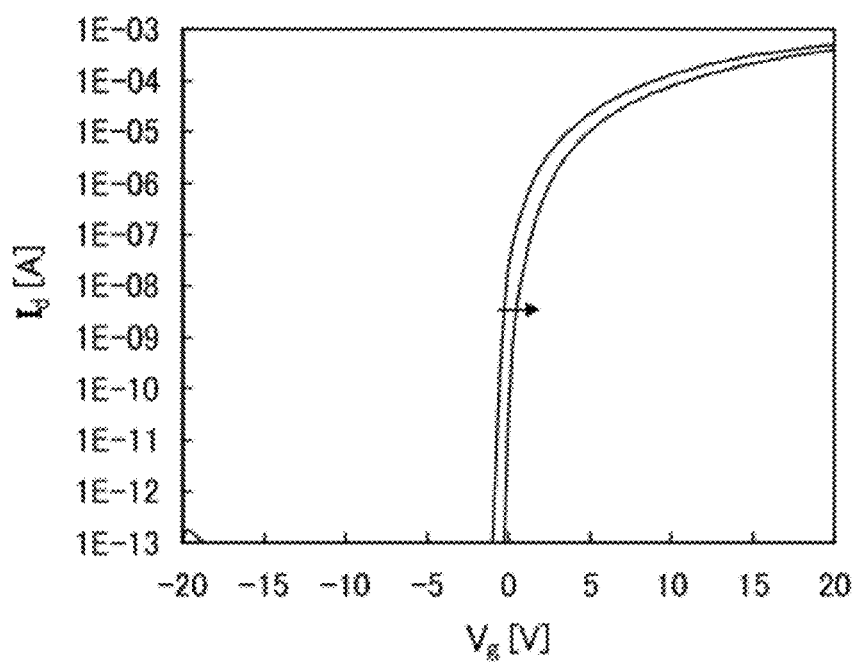
FIGS. 11A and 11B are graphs each showing characteristics of a transistor in which a channel is formed in an oxide semiconductor layer.
Figure 11B:
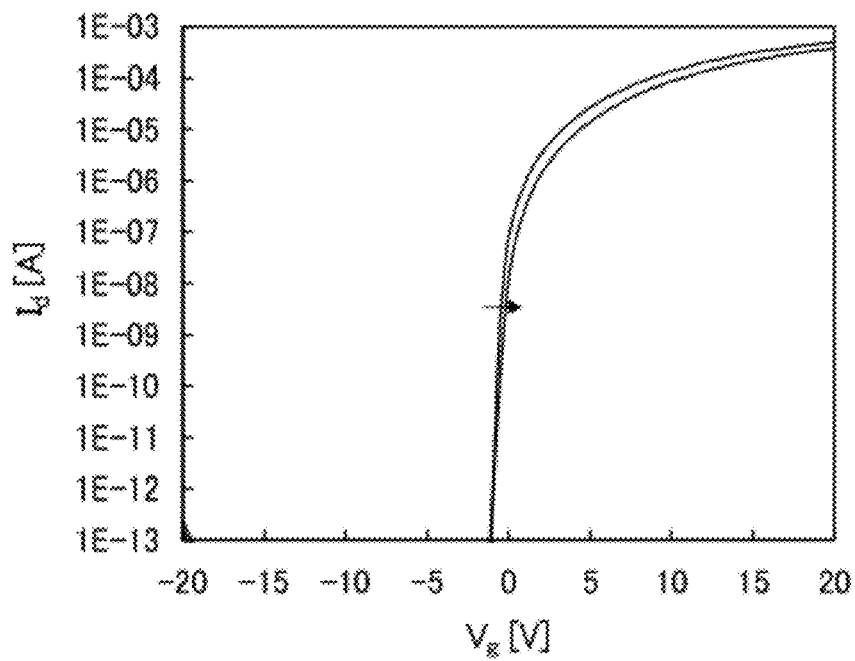

FIGS. 10A and 10B show results of the positive BT test and the negative BT test, respectively, of Sample 1. FIGS. 11A and 11B show results of the positive BT test and the negative BT test, respectively, of Sample 2.

The amount of change in threshold voltage of Sample 1 due to the positive BT test and that due to the negative BT test were 1.80 V and −0.42 V, respectively. The amount of change in threshold voltage of Sample 2 due to the positive BT test and that due to the negative BT test were 0.79 V and 0.76 V, respectively. It is found that, in each of Sample 1 and Sample 2, the amount of change in threshold voltage due to the BT tests is small and the reliability of each transistor is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby the effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a film in contact with the oxide semiconductor; however, when excess oxygen is included in the oxide semiconductor by the heat treatment, oxygen deficiency caused constantly can be compensated for with excess oxygen. The excess oxygen is mainly oxygen existing between lattices. When the concentration of oxygen is set in the range of $1\times10^{16}/cm^3$ to $2\times10^{20}/cm^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed with X-ray diffraction.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 12:
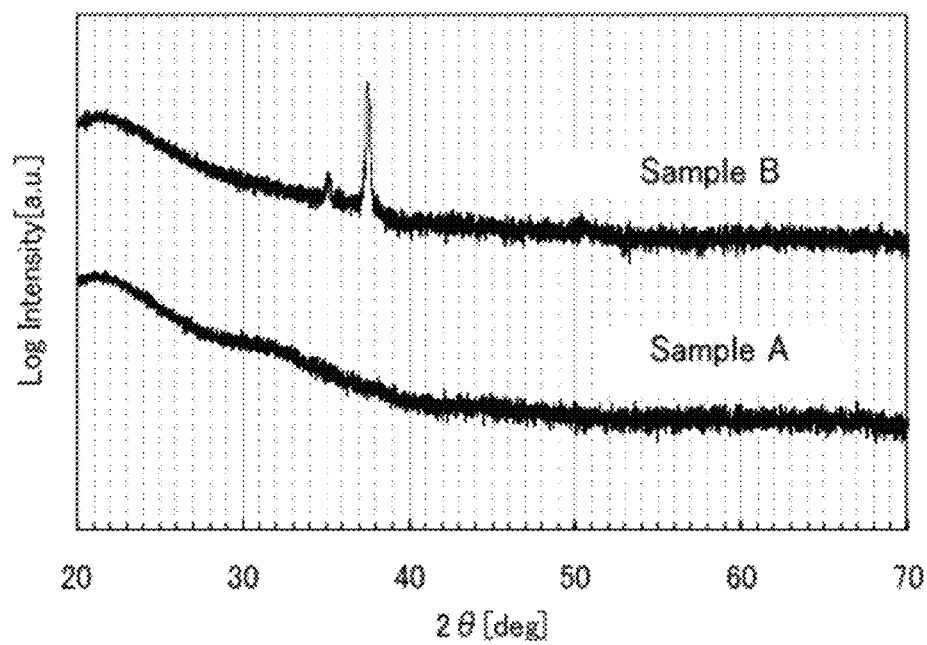
FIG. 12 is a graph showing XRD spectra.

FIG. 12 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during film formation of an oxide semiconductor containing In, Sn, and Zn as main components and/or by performing heat treatment after the film formation, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 13:
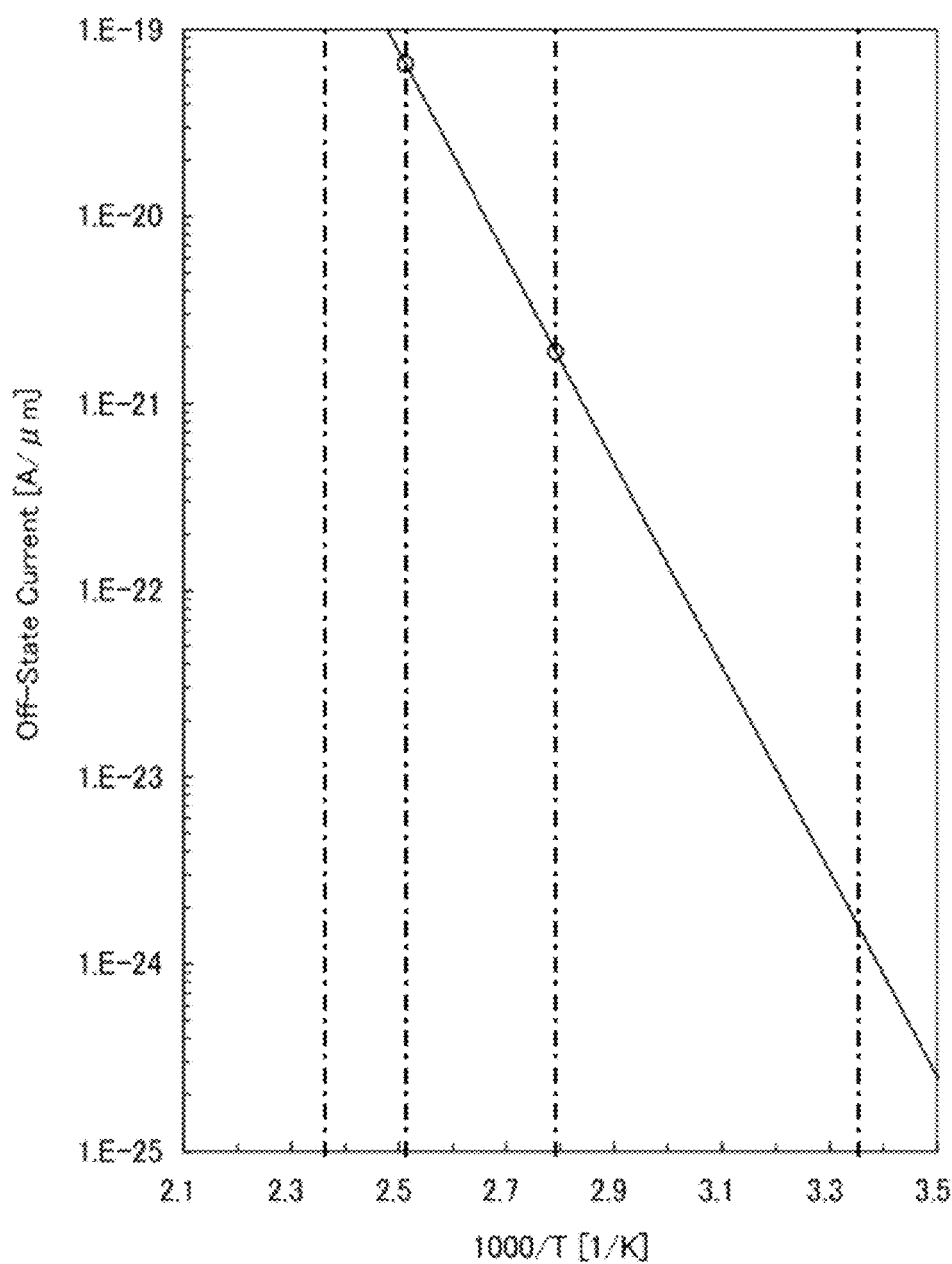
FIG. 13 is a graph showing characteristics of a transistor in which a channel is formed in an oxide semiconductor layer.

Specifically, as shown in FIG. 13, the off-state current can be 1 aA/μm ($1 \times 10^{-18}$ A/μm) or lower, 100 zA/μm ($1 \times 10^{-19}$ A/μm) or lower, and 1 zA/μm ($1 \times 10^{-21}$ A/μm) or lower when the substrate temperature is 125° C., 85° C., and a room temperature (27° C.), respectively. Preferably, the off-state current can be 0.1 aA/μm ($1 \times 10^{-19}$ A/μm) or lower, 10 zA/μm ($1 \times 10^{-20}$ A/μm) or lower, and 0.1 zA/μm ($1 \times 10^{-22}$ A/μm) or lower at 125° C., 85° C., and a room temperature, respectively.

Note that in order to prevent hydrogen and moisture from being included in the oxide semiconductor film during formation thereof, it is preferable to increase the purity of a sputtering gas by sufficiently suppressing leakage from the outside of a film formation chamber and degasification through an inner wall of the film formation chamber. For example, a gas with a dew point of −70° C. or lower is preferably used as the sputtering gas in order to prevent moisture from being included in the film. In addition, it is preferable to use a target which is highly purified so as not to include impurities such as hydrogen and moisture. Although it is possible to remove moisture from a film of an oxide semiconductor containing In, Sn, and Zn as main components by heat treatment, a film which does not include moisture originally is preferably formed. This is because moisture is released from the oxide semiconductor containing In, Sn, and Zn as main components at a higher temperature than from an oxide semiconductor containing In, Ga, and Zn as main components.

The relation between the substrate temperature and electrical characteristics of a transistor using Sample B on which heat treatment at 650° C. was performed after formation of the oxide semiconductor film was evaluated.

The transistor used for the measurement has a channel length L of 3 μm, a channel width W of 10 μm, Lov of 3 μm per side (6 μm in total), and dW of 0 μm. Note that $V_d$ was set to 10 V. Note that the substrate temperature was −40° C., −25° C., 25° C., 75° C., 125° C., and 150° C. Here, in the transistor, the width of a portion where a gate electrode overlaps with one of a pair of electrodes is referred to as Lov, and the width of a portion of the pair of electrodes, which does not overlap with an oxide semiconductor film, is referred to as dW.

Figure 14A:
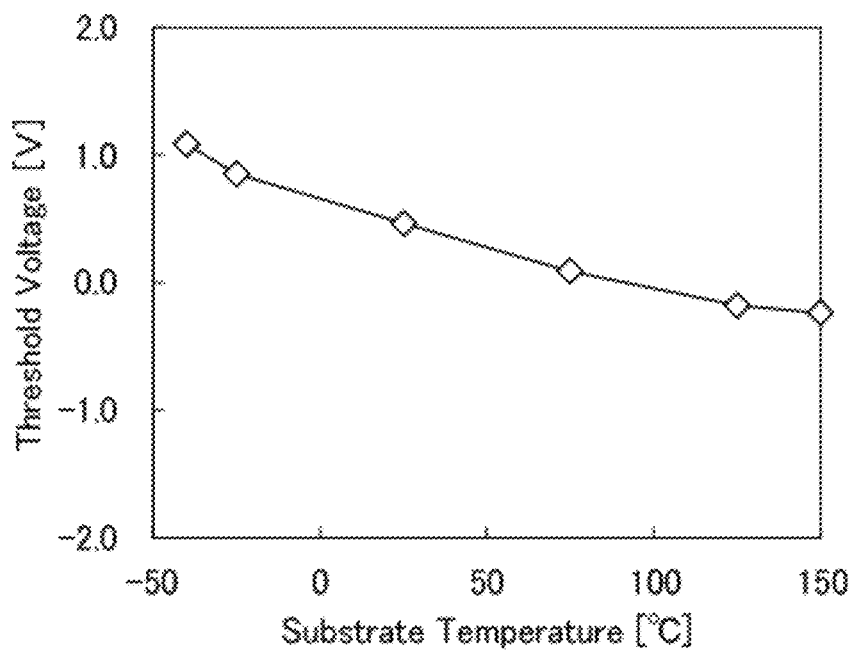
FIGS. 14A and 14B are graphs each showing characteristics of a transistor in which a channel is formed in an oxide semiconductor layer.
Figure 14B:
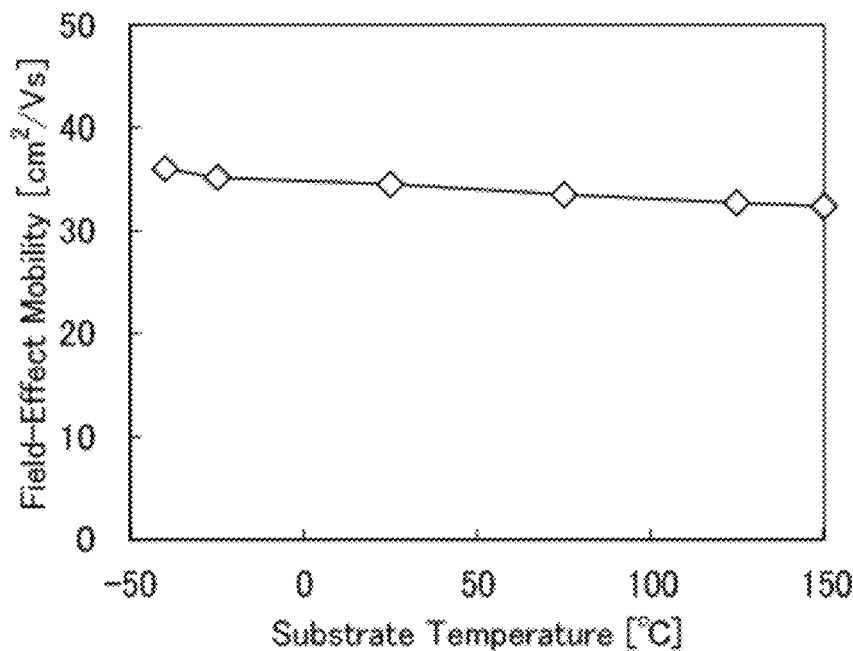

FIG. 14A shows a relation between the substrate temperature and the threshold voltage, and FIG. 14B shows a relation between the substrate temperature and the field-effect mobility.

From FIG. 14A, it is found that the threshold voltage gets lower as the substrate temperature increases. Note that the threshold voltage is decreased from 1.09 V to −0.23 V in the range from −40° C. to 150° C.

From FIG. 14B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that change in electrical characteristics is small in the above temperature range.

In a transistor in which such an oxide semiconductor containing In, Sn, and Zn as main components is used as a channel formation region, a field-effect mobility of 30 cm$^2$/Vsec or higher, preferably 40 cm$^2$/Vsec or higher, further preferably 60 cm$^2$/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electrical characteristics can be ensured in a temperature range needed for operation of a transistor.

This embodiment can be implemented in combination with any of the other embodiments as appropriate.

EXAMPLE 1

The method for driving a display device described in any of the above embodiments can be employed in a display device provided in various electronic devices.

For example, the method for driving a display device described in any of the above embodiments can be employed in a display device provided in the following electronic devices: a personal computer, an image reproducing device including a recording medium (typically a device that reproduces a recording medium such as a digital versatile disc (DVD) and includes a display portion for displaying the reproduced image), a mobile phone, a game machine including a portable game machine, a portable information terminal, an e-book reader, a video camera, a digital still camera, a goggle display (head mounted display), navigation system, a copier, a facsimile machine, a printer, a multifunction printer, an automated teller machine (ATM), or the like.

Thus, an electronic device in which power consumption is reduced and the display quality of a display screen is not reduced can be provided.

This example can be implemented in combination with any of the other embodiments.

This application is based on Japanese Patent Application serial no. 2011-107032 filed with Japan Patent Office on May 12, 2011, the entire contents of which are hereby incorporated by reference.

What is claimed is:

1. A method for driving a display device, comprising the steps of:
   carrying out a first operation for holding a threshold voltage of a transistor in a capacitor; and
   carrying out a second operation for inputting a potential to a gate of the transistor, so that a drain current of the transistor flows into a load element,
   wherein the potential is made by adding a signal potential corresponding to an image signal and a potential of the threshold voltage of the transistor with the use of a capacitive coupling by the capacitor, and
   wherein the first operation is carried out once in a plurality of frames.

2. The method for driving a display device, according to claim 1,
   wherein a switch that determines whether the capacitor is electrically connected to a wiring to which a power supply potential is input is included, and wherein the switch is formed using a transistor in which a channel is formed in an oxide semiconductor layer.

3. The method for driving a display device, according to claim 1,
wherein a first switch that determines whether the capacitor is electrically connected to a first wiring to which a first power supply potential is input, and a second switch that determines whether the capacitor is electrically connected to a second wiring to which a second power supply potential different from the first power supply potential is input are included, and
wherein the first switch and the second switch are each formed using a transistor in which a channel is formed in an oxide semiconductor layer.

4. The method for driving a display device, according to claim 1, wherein the first operation is carried out once in ten or more frames.

5. The method for driving a display device, according to claim 1, wherein frequency of the first operation is lower than frequency of the second operation.

6. The method for driving a display device, according to claim 1, wherein the load element is an electrooptic element a luminance of which is controlled by a value of a current that flows.

7. The method for driving a display device, according to claim 1, wherein the load element is an electroluminescent element.

8. A method for driving a display device, comprising the steps of:
carrying out a first operation for holding a threshold voltage of a transistor in a capacitor; and
carrying out a second operation for inputting a signal potential corresponding to an image signal to one of a pair of electrodes of the capacitor and inputting a potential of the other of the pair of electrodes of the capacitor to a gate of the transistor, so that a drain current of the transistor flows into a load element,
wherein the first operation is carried out once in a plurality of frames.

9. The method for driving a display device, according to claim 8,
wherein a switch that determines whether the capacitor is electrically connected to a wiring to which a power supply potential is input is included, and
wherein the switch is formed using a transistor in which a channel is formed in an oxide semiconductor layer.

10. The method for driving a display device, according to claim 8,
wherein a first switch that determines whether the capacitor is electrically connected to a first wiring to which a first power supply potential is input, and a second switch that determines whether the capacitor is electrically connected to a second wiring to which a second power supply potential different from the first power supply potential is input are included, and
wherein the first switch and the second switch are each formed using a transistor in which a channel is formed in an oxide semiconductor layer.

11. The method for driving a display device, according to claim 8, wherein the first operation is carried out once in ten or more frames.

12. The method for driving a display device, according to claim 8, wherein frequency of the first operation is lower than frequency of the second operation.

13. The method for driving a display device, according to claim 8, wherein the load element is an electrooptic element a luminance of which is controlled by a value of a current that flows.

14. The method for driving a display device, according to claim 8, wherein the load element is an electroluminescent element.

15. A display device comprising:
first to sixth transistors;
a capacitor comprising a first electrode and a second electrode; and
a load element,
wherein the first electrode is electrically connected to one of a source and a drain of the first transistor and directly connected to one of a source and a drain of the fifth transistor,
wherein the second electrode is electrically connected to a gate of the sixth transistor and one of a source and a drain of the second transistor,
wherein the other of the source and the drain of the second transistor is electrically connected to one of a source and a drain of the sixth transistor and one of a source and a drain of the fourth transistor, and
wherein the other of the source and the drain of the sixth transistor is directly connected to the other of the source and the drain of the fifth transistor, electrically connected to one of a source and a drain of the third transistor, and electrically connected to one of a pair of electrodes of the load element.

16. The display device according to claim 15,
wherein the sixth transistor comprises an oxide semiconductor.

17. The display device according to claim 15,
wherein the other of the source and the drain of the first transistor is electrically connected to a first terminal, and
wherein a signal potential corresponding to an image signal is input to the first terminal.

18. The display device according to claim 15,
wherein the other of the pair of electrodes of the load element is electrically connected to a second terminal.

19. The display device according to claim 15,
wherein the other of the source and the drain of the third transistor is electrically connected to a third terminal.

20. The display device according to claim 15,
wherein the other of the source and the drain of the fourth transistor is electrically connected to a fourth terminal.

* * * * *